United States Patent
Lee et al.

(10) Patent No.: US 11,244,900 B2
(45) Date of Patent: Feb. 8, 2022

(54) WIRING STRUCTURES HAVING A METAL PATTERN INTERSECTION PORTION

(71) Applicant: Samsung Electronics Co., Ltd., Suwon-si (KR)

(72) Inventors: Jeonggil Lee, Hwaseong-si (KR); Sukhoon Kim, Hwaseong-si (KR); Sungmyong Park, Hwaseong-si (KR); Chanyang Lee, Suwon-si (KR); Honyun Park, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/029,183

(22) Filed: Sep. 23, 2020

(65) Prior Publication Data

US 2021/0225767 A1      Jul. 22, 2021

(30) Foreign Application Priority Data

Jan. 17, 2020   (KR) .......................... 10-2020-0006397

(51) Int. Cl.
| | |
|---|---|
| *H01L 23/528* | (2006.01) |
| *H01L 27/11582* | (2017.01) |
| *H01L 27/11565* | (2017.01) |
| *H01L 27/11575* | (2017.01) |
| *H01L 27/11573* | (2017.01) |

(52) U.S. Cl.
CPC ........ *H01L 23/5283* (2013.01); *H01L 23/528* (2013.01); *H01L 27/11565* (2013.01); *H01L 27/11573* (2013.01); *H01L 27/11575* (2013.01); *H01L 27/11582* (2013.01)

(58) Field of Classification Search
CPC ............... H01L 23/528; H01L 23/5283; H01L 27/11556; H01L 27/11582
See application file for complete search history.

(56) References Cited

U.S. PATENT DOCUMENTS

| | | | | |
|---|---|---|---|---|
| 5,094,973 | A | * | 3/1992 | Pang .................... H01L 21/763 |
| | | | | 257/374 |
| 7,235,424 | B2 | | 6/2007 | Chen et al. |
| 8,097,951 | B2 | | 1/2012 | Matsuda |
| 8,369,135 | B1 | | 2/2013 | Mani |

(Continued)

FOREIGN PATENT DOCUMENTS

| | | | |
|---|---|---|---|
| CN | 102981326 A | 3/2013 | |
| JP | 2003037011 A | 2/2003 | |
| WO | WO-0070672 A1 * | 11/2000 | ......... H01L 23/5386 |

*Primary Examiner* — Younes Boulghassoul
(74) *Attorney, Agent, or Firm* — Myers Bigel, P.A.

(57) ABSTRACT

A wiring structure includes first to third metal patterns on a substrate. The first metal pattern extends in a second direction and has a first width in a third direction. The second metal pattern extends in the third direction to cross the first metal pattern and have a second width in the second direction. The third metal pattern is connected to the first and second metal patterns at an area where the first and second metal patterns cross each other, and has a substantially rectangular shape with concave portions in each quadrant. The third metal pattern has a third width defined as a minimum distance between opposite ones of the concave portions in a fourth direction having an acute angle to the second and third directions, which is less or equal to than a smaller of the first and second widths.

20 Claims, 26 Drawing Sheets

(56) References Cited

U.S. PATENT DOCUMENTS

| | | | |
|---|---|---|---|
| 8,377,794 B2* | 2/2013 | Tajima | H01L 21/76232 |
| | | | 438/424 |
| 8,841,774 B2 | 9/2014 | Ichiryu et al. | |
| 9,590,288 B2 | 3/2017 | Saji et al. | |
| 9,911,643 B2* | 3/2018 | Li | H01L 23/5226 |
| 10,170,439 B1 | 1/2019 | Khor et al. | |
| 2009/0090992 A1* | 4/2009 | Lerner | H01L 21/76264 |
| | | | 257/506 |
| 2011/0108958 A1* | 5/2011 | Webb | H01L 23/481 |
| | | | 257/621 |
| 2012/0112364 A1 | 5/2012 | Chang | |

* cited by examiner

WIRING STRUCTURES HAVING A METAL PATTERN INTERSECTION PORTION

CROSS-REFERENCE TO RELATED APPLICATION

This application claims priority under 35 U.S.C. § 119 to Korean Patent Application No. 10-2020-0006397, filed on Jan. 17, 2020, in the Korean Intellectual Property Office (KIPO), the contents of which are herein incorporated by reference in their entirety.

BACKGROUND

1. Technical Field

Aspects of the present disclosure relate to wiring structures and to vertical memory devices including the same.

2. Description of the Related Art

A portion of a metal wiring at a region where metal wirings extending in respective directions crossing each other at a right angle meet may have a width greater than those of other portions of the metal wiring, and the portion of the metal wiring may not be continuous so that the characteristics of the metal wiring may be deteriorated.

SUMMARY

Example embodiments provide a wiring structure having improved electrical characteristics.

Example embodiments provide a vertical memory device including a wiring structure having improved electrical characteristics.

According to some example embodiments, there is provided a wiring structure. The wiring structure may include a first metal pattern, a second metal pattern, and a third metal pattern. The first metal pattern may be formed on a substrate. The first metal pattern may extend in a second direction that is parallel to an upper surface of the substrate and may have a first width in a third direction that is parallel to the upper surface of the substrate and perpendicular to the second direction. The second metal pattern may extend in the third direction to cross the first metal pattern and have a second width in the second direction. The third metal pattern may be located at an area where the first and second metal patterns cross each other on the substrate. The third metal pattern may be connected to the first and second metal patterns and have a substantially rectangular shape in a plan view. The third metal pattern may have concave portions in each quadrant thereof. The third metal pattern may have a third width defined as a minimum distance between opposite ones of the concave portions in a fourth direction parallel to the upper surface of the substrate and that has an acute angle with respect to each of the second and third directions, and the third width may be less than or equal to a smaller of the first and second widths. The first metal pattern may have a first boundary surface at a central portion in the third direction thereof. The first boundary surface may extend in a first direction perpendicular to the upper surface of the substrate. The third metal pattern may have a third boundary surface at a central portion in the fourth direction thereof. The third boundary surface may extend in the first direction. A bottom of the first boundary surface may be farther from the substrate than a bottom of the third boundary surface.

According to some example embodiments, there is provided a wiring structure. The wiring structure may include a first metal pattern, a second metal pattern, a third metal pattern, and an insulation spacer. The first metal pattern may be formed on a substrate. The first metal pattern may extend in a second direction that is parallel to an upper surface of the substrate and have a first width in a third direction that is parallel to the upper surface of the substrate and perpendicular to the second direction. The second metal pattern may extend in the third direction to cross the first metal pattern and have a second width in the second direction. The third metal pattern may be located at an area where the first and second metal patterns cross each other on the substrate. The third metal pattern may be connected to the first and second metal patterns and have a substantially rectangular shape in a plan view. The insulation spacer may be on the substrate. The insulation spacer may be at a central portion of the third metal pattern in a plan view and may cover a sidewall of the third metal pattern. A third width defined as a minimum distance between a vertex of the third metal pattern and the insulation spacer may be less than or equal to a smaller of the first and second widths.

According to some example embodiments, there is provided a wiring structure. The wiring structure may include a first metal pattern, a second metal pattern, and a third metal pattern. The first metal pattern may be formed on a substrate. The first metal pattern may extend in a second direction that is parallel to an upper surface of the substrate and have a first width in a third direction that is parallel to the upper surface of the substrate and perpendicular to the second direction. The second metal pattern may extend in the third direction and have the first width in the second direction. The third metal pattern may be at an area where an end portion of the first metal pattern meets an end portion of the second metal pattern. The third metal pattern may be connected to the first and second metal patterns and have a substantially triangular shape. A second width defined as a minimum distance from a vertex of the third metal pattern to an opposite edge thereof in a fourth direction that is parallel to the upper surface of the substrate and that has an acute angle with respect to each of the second and third directions may be equal to or less than the first width. Each metal pattern may have a respective boundary surface at a central portion thereof, and may extend in a first direction perpendicular to the upper surface of the substrate. A bottom of the boundary surfaces of the first and second metal patterns may be farther from the substrate than a bottom of the boundary surface of the third metal pattern.

According to some example embodiments, there is provided a wiring structure. The wiring structure may include a first metal pattern, a second metal pattern, and a third metal pattern. The first metal pattern may be on a substrate. The first metal pattern may extend in a second direction that is parallel to an upper surface of the substrate and have a first width in a third direction that is parallel to the upper surface of the substrate and perpendicular to the second direction. The second metal pattern may extend in the third direction and have the first width in the second direction. The third metal pattern may be at an area where an end portion of the first metal pattern meets an end portion in the third direction of the second metal pattern. The third metal pattern may be connected to the first and second metal patterns and have a substantially triangular shape in a plan view that includes a concave portion. A minimum width between the concave portion of the third metal pattern and another vertex thereof in a fourth direction that is parallel to the upper surface of the substrate and that has an acute angle with respect to each of the second and third directions may be equal to or less the first width. Each metal pattern may have a boundary surface at a central portion thereof. Each boundary surface may extend in a first direction perpendicular to the upper surface of the substrate. A bottom of each of boundary surfaces of the first and second metal patterns may be farther from the substrate than a bottom of the boundary surface of the third metal pattern.

According to some example embodiments, there is provided a wiring structure. The wiring structure may include a first metal pattern, a second metal pattern, and a third metal pattern. The first metal pattern may be on a substrate. The first metal pattern may extend in a second direction that is parallel to an upper surface of the substrate and have a first width in a third direction that is parallel to the upper surface of the substrate and perpendicular to the second direction. The second metal pattern may extend in the third direction and have a second width in the second direction. The third metal pattern may be at an area where a central portion of the first metal pattern meets an end portion of the second metal pattern. The third metal pattern may be connected to the first and second metal patterns and have a substantially rectangular shape including first and second sides facing each other in the third direction. The second side of the rectangle may be free of contact with the second metal pattern and may be concave. A third width defined as a minimum distance between the first and second sides of the third metal pattern in the third direction may be less than or equal to a smaller of the first and second widths. Each metal pattern may have a boundary surface at a central portion thereof, which may extend in a first direction perpendicular to the upper surface of the substrate. A bottom of each of boundary surfaces of the first and second metal patterns may be farther from the substrate than a bottom of the boundary surface of the third metal pattern.

According to some example embodiments, there is provided a wiring structure. The wiring structure may include a first metal pattern, a second metal pattern, and a third metal pattern. The first metal pattern may be formed on a substrate. The first metal pattern may extend in a second direction that is parallel to an upper surface of the substrate and have a first width in a third direction that is parallel to the upper surface of the substrate and perpendicular to the second direction. The second metal pattern may extend in the third direction and have a second width in the second direction. The third metal pattern may be at an area where the first and second metal patterns cross or meet each other. The third metal pattern may be connected to the first and second metal patterns. A minimum width between portions of the third metal pattern in a fourth direction parallel to the upper surface of the substrate and having an acute angle with respect to each of the second and third directions may be equal to or less than the first width. An angle of a sidewall of the first metal pattern with respect to a first direction perpendicular to the upper surface of the substrate and an angle of a sidewall of the second metal pattern with respect to the first direction may be greater than an angle of a sidewall of the third metal pattern with respect to the first direction.

According to some example embodiments, there is provided a vertical memory device. The vertical memory device may include a transistor, a lower wiring structure, a second substrate, gate electrodes, channels, and an upper wiring structure. The transistor may be formed on a first substrate. The lower wiring structure may be formed on the first substrate, and may be electrically connected to the transistor. The second substrate may be formed on the transistor and the lower wiring structure. The gate electrodes may be spaced apart from each other in a first direction on the second substrate. The first direction may be perpendicular to an upper surface of the second substrate. Each of the channels may extend through the gate electrodes in the first direction on the second substrate. The upper wiring structure may be formed on the gate electrodes, and may be electrically connected to the gate electrodes. The lower wiring structure and/or the upper wiring structure may include a first metal pattern, a second metal pattern, and a third metal pattern. The first metal pattern may be formed on the first substrate. The first metal pattern may extend in a second direction that is parallel to an upper surface of the first substrate and have a first width in a third direction that is parallel to the upper surface of the first substrate and perpendicular to the second direction. The second metal pattern may extend in the third direction and having a second width in the second direction. The third metal pattern may be at an area where the first and second metal patterns meet each other. The third metal pattern may be connected to the first and second metal patterns. A minimum width between portions of the third metal pattern in a fourth direction parallel to the upper surface of the substrate and having an acute angle with respect to each of the second and third directions may be equal to or less than the first width. Each metal pattern may have a boundary surface at a central portion thereof that extends perpendicular to the upper surface of the substrate. A bottom of the boundary surface of the first metal pattern is farther from a substrate than a bottom of the boundary surface of the third metal pattern.

The vertical memory device in accordance with some example embodiments may include wiring structures having no void therein or cut portion, and thus may have improved electrical characteristics.

DETAILED DESCRIPTION

Wiring structures and methods of forming the same, as well as vertical memory devices and methods of manufacturing the same in accordance with some example embodiments will be described more fully hereinafter with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section.

Hereinafter in the specifications (not necessarily in the claims), a direction substantially perpendicular to an upper surface of a substrate may be defined as a first direction, and two directions substantially parallel to the upper surface of the substrate and crossing each other may be defined as second and third directions, respectively. Two directions substantially parallel to the upper surface of the substrate and having acute angles with respect to the second and third directions, respectively, may be defined as fourth and fifth directions, respectively. In some example embodiments, the second and third directions may be substantially perpendicular to each other, and the fourth and fifth directions may each have an angle of 45 degrees with respect to the second and third directions, respectively. The fourth and fifth directions may be substantially perpendicular to each other.

Figure 1:
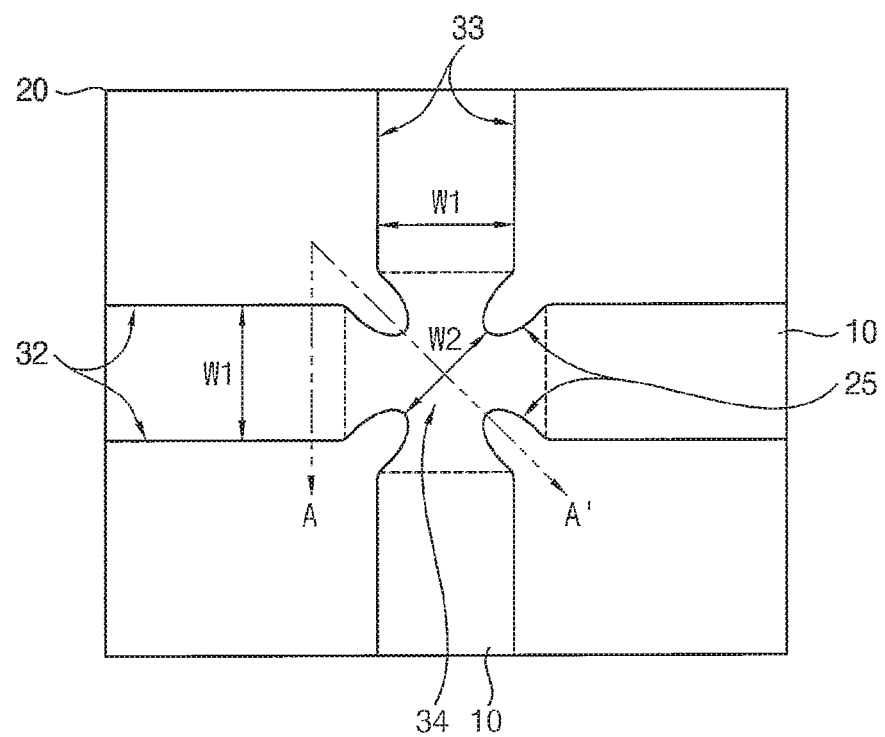
FIGS. 1 to 6 are plan views and cross-sectional views illustrating a method of forming a wiring structure in accordance with some example embodiments.
Figure 1:
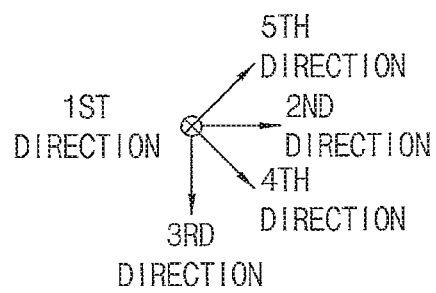
Figure 2:
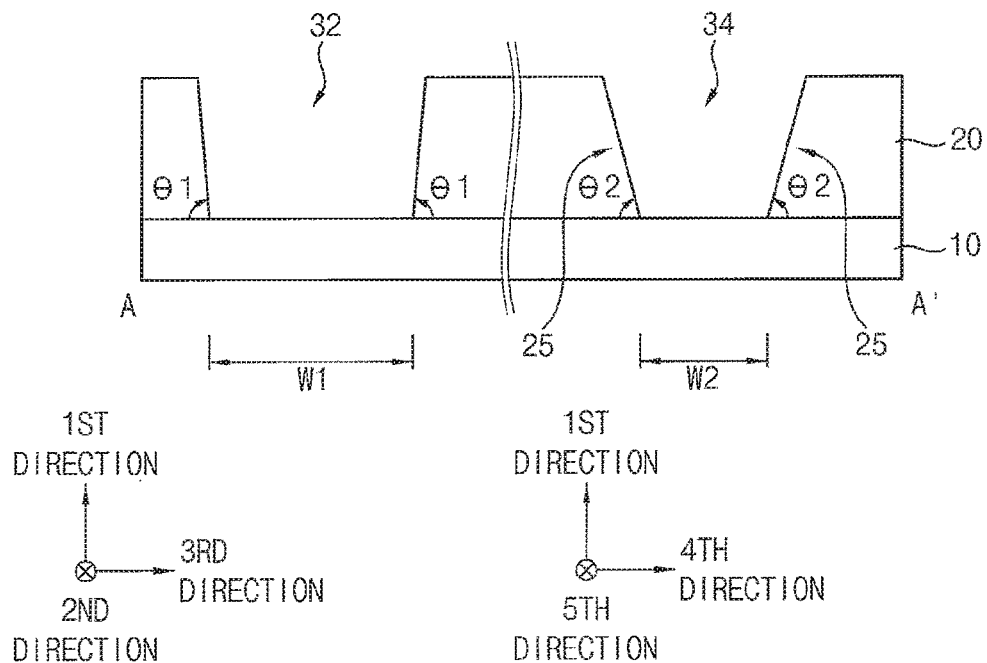
Figure 3:
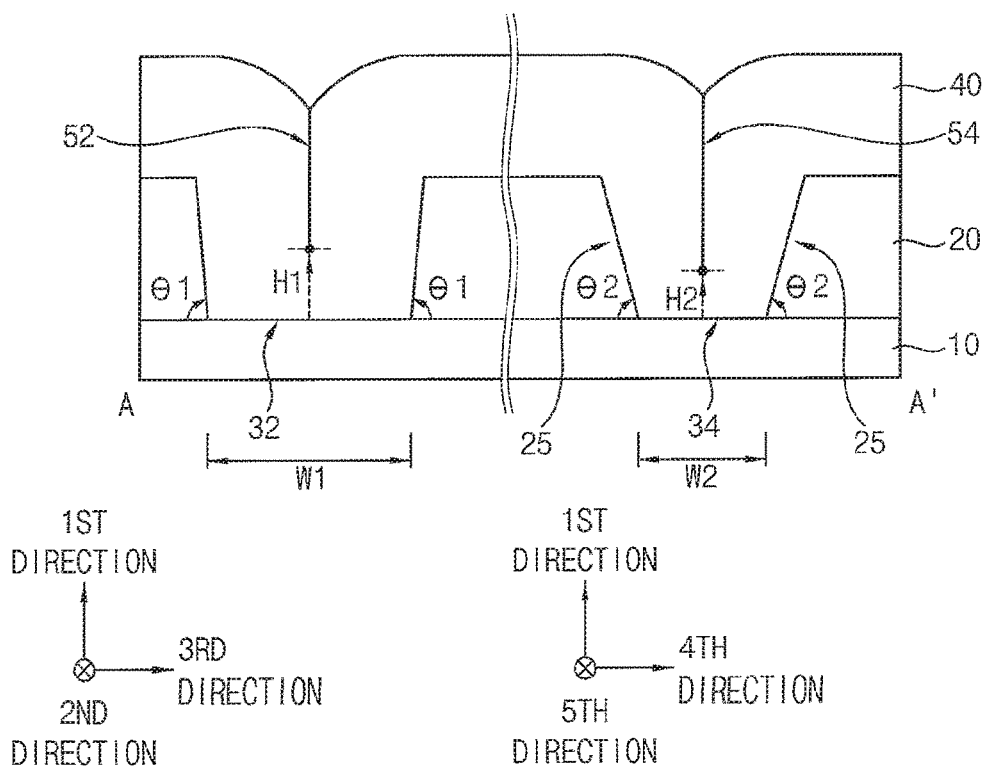
Figure 4:
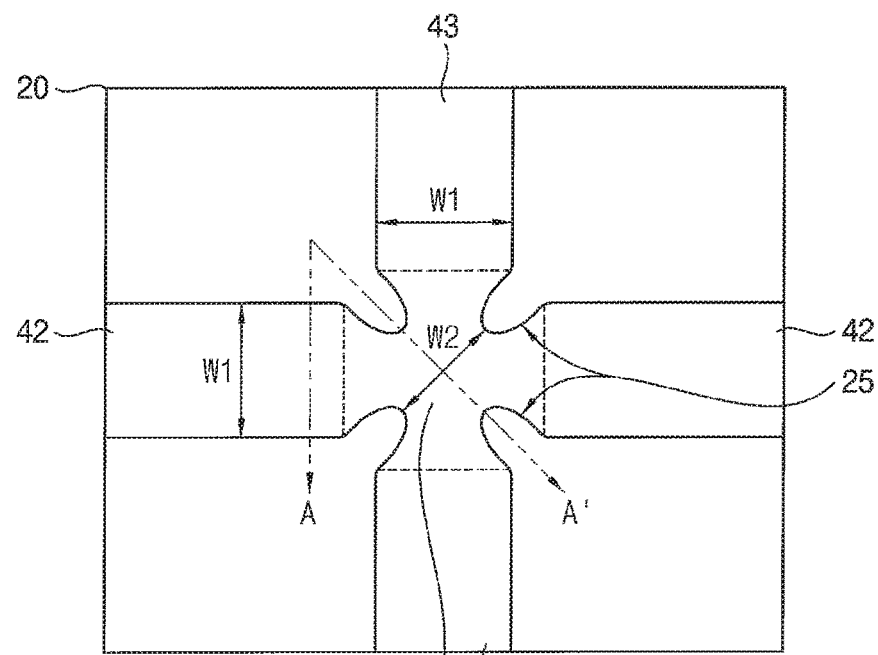
Figure 4:
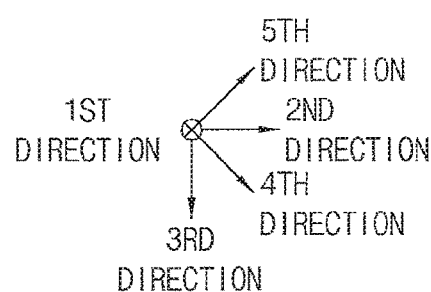

FIGS. 1 to 6 are plan views and cross-sectional views illustrating a method of forming a wiring structure in accordance with some example embodiments. Specifically, FIGS. 1 and 4 are plan views, and FIGS. 2-3 and 5-6 are cross-sectional views taken along a line A-A' of FIG. 1. A first portion of the line A-A' of FIG. 1 extends in the third direction, and a second portion of the line A-A' of FIG. 1 extends in the fourth direction.

Referring to FIGS. 1 and 2, an insulating interlayer 20 may be formed on a substrate 10, and may be partially etched to form first, second and third openings 32, 33 and 34 each exposing an upper surface of the substrate 10.

In some example embodiments, the first and second openings 32 and 33 may extend in the second and third directions, respectively, and the third opening 34 may be connected to the first and second openings 32 and 33 at an area where the first and second openings 32 and 33 meet or cross each other. In some example embodiments, a portion of the insulating interlayer 20 adjacent the third opening 34 may include a protrusion portion 25 protruding toward a center of the third opening 34 in a plan view. That is, the third opening 34 may have a shape of a rectangle with concave portions in each quadrant of the third opening 34. The concave portions may be referred to herein as vertex portions. The concave portions or vertex portions of the third opening 34 may be defined by a concave curve, edge, or arc segment adjacent to a protrusion portion 25 of the insulating interlayer 20. In some example embodiments, each concave portion may be defined by a concave curve, edge, or arc segment, which may be elliptic or partially elliptic. Each concave curve, edge, or arc segment may begin at a point adjacent to the first opening 32 and may extend to a point adjacent to the second opening 33. In some embodiments, the third opening 34 may have a shape of a cross with arms that are narrower at a center of the third opening 34 and that are flared to be wider at a perimeter of the third opening 34. The perimeter of the third opening 34 may be where the third opening 34 meets the first and second openings 32 and 33.

The first opening 32 may have a first width W1 in the third direction, the second opening 33 may have the first width W1 in the second direction, and the third opening 34 may have a second width W2 equal to or less than the first width W1. The second width W2 may be defined as the minimum distance between the protrusion portions 25 of the insulating interlayer 20 facing each other in each of the fourth and fifth directions.

In some embodiments, the insulating interlayer 20 may not have the protrusion portions 25, and the third opening 34 may have a shape of a rectangle (with rounded vertices in some example embodiments), rectellipse, and/or superellipse in a plan view. In embodiments where the insulating interlayer 20 does not have the protrusion portions, widths of the third opening 34 in the fourth and fifth directions may be greater than the first width W1. On the other hand, in embodiments in which the insulating interlayer 20 has the protrusion portions 25, the widths of the third opening 34 in the fourth and fifth directions may be equal to or less than the first width W1. Hereinafter, only the case in which the second width W2 is less than the first width W1 will be described.

In some example embodiments, and differing from the embodiment illustrated in FIG. 1, the first and second openings 32 and 33 may have differing widths, and the width of the first opening 32 may be less than or greater than the width of the second opening 33. The inventive concepts described herein are demonstrated in some example embodiments in which both of the widths of the first and second openings 32 and 33 are greater than the second width W2. That is, although the width of the second opening 33 may be more or less than the width of the first opening 32, each is greater than the second width W2 of the third opening 34.

In some example embodiments, a first angle θ1 of a sidewall of each of the first and second openings 32 and 33 with respect to the upper surface of the substrate 10 (e.g., the sidewalls of the openings having relatively larger widths, or the first width W1) may be greater than a second angle θ2 of a sidewall of the third opening 34 (e.g., a sidewall of the opening having a relatively smaller width, or the second width W2). The first angle θ1 may be closer to a perpendicular angle than the second angle θ2. This may be because an etching gas used in an etching process for forming the first to third openings 32, 33 and 34 may be more easily provided to lower portions of the first and second openings 32 and 33 due to the characteristics of the etching process.

As each of the first to third openings 32, 33 and 34 has sidewalls that are not perpendicular but slanted with respect to the upper surface of the substrate 10, a width of a lower portion of each of the first to third openings 32, 33 and 34 may be less than a width of an upper portion thereof. Herein, a width of each of the first to third openings 32, 33 and 34 will be referred to a width of the bottom thereof, or of a portion adjacent the upper surface of the substrate 10. That is, the bottom of each of the first and second openings 32 and 33 may have the first width W1, and the bottom of the third opening 34 may have the second width W2.

The insulating interlayer 20 may include an oxide, e.g., silicon oxide, or a nitride, e.g., silicon nitride.

In some example embodiments, each of the first to third openings 32, 33 and 34 may not necessarily expose the upper surface of the substrate 10, and may extend only partially through the insulating interlayer 20. In some example embodiments, each of the first to third openings 32, 33 and 34 may expose an upper surface of a structure that may be contained in the insulating interlayer 20.

Referring to FIG. 3, a metal layer 40 may be formed on the substrate 10 and on the insulating interlayer 20, which may fill the first to third openings 32, 33 and 34.

The metal layer 40 may include, e.g., tungsten, aluminum, copper, etc. The metal layer 40 may be formed by any process selected based on the material used to form the metal layer 40. For example, if the metal layer 40 includes tungsten, aluminum, etc., the metal layer 40 may be formed by a deposition process, e.g., a chemical vapor deposition (CVD) process. As another example, if the metal layer 40 includes copper, the metal layer 40 may be formed by an electroplating (EP) process. Hereinafter, only some of the example embodiments in which the metal layer 40 includes tungsten, aluminum, etc., by a deposition process will be described.

Before forming the metal layer 40 on bottoms and sidewalls of the first to third openings 32, 33 and 34 and an upper surface of the insulating interlayer 20, a barrier layer (not shown) including a metal nitride, e.g., titanium nitride, tantalum nitride, etc., may be further formed thereon.

In some example embodiments, during the deposition process, the metal layer 40 may be gradually deposited into the first to third openings 32, 33 and 34, and starting from the bottoms and the sidewalls thereof. Thus, a first boundary surface 52, e.g., a seam that extends in the first direction at a central portion of the first opening 32 in the third direction may be formed, and a third boundary surface 54, e.g., a seam that extends in the first direction at a central portion of the third opening 34 in the third direction may be formed. Meanwhile, a second boundary surface (not shown), e.g., a seam extending in the first direction at a central portion of the second opening 33 in the third direction may be also formed.

The boundary surfaces may not contact the substrate 10. In some example embodiments, a first height H1 in the first direction of a bottom of the first boundary surface 52 (that is, a distance from the upper surface of the substrate 10 to the bottom of the first boundary surface 52) or the second boundary surface may be greater than a second height H2 in the first direction of a bottom of the third boundary surface 54 (that is, a distance from the upper surface of the substrate 10 to the bottom of the third boundary surface 54). This is because when the metal layer 40 is deposited onto opposite sidewalls of each of the first and second openings 32 and 33 having the relatively large widths, it takes a longer time for portions of the metal layer 40 from the opposite sidewalls to contact each other, and thus a portion of the metal layer 40 deposited onto the bottom of each of the first and second openings 32 and 33 when the portions of the metal layer 40 from the opposite sidewalls to contact each other may have a greater height.

The deposition process may be based on the widths of the first and second openings 32 and 33, such as the first width W1. As such, in embodiments in which the insulating interlayer 20 does not include the protrusion portions 25, unlike a portion of the metal layer 40 deposited in the first and second openings 32 and 33 extending in the second and third directions, respectively, and having the first width W1, a portion of the metal layer 40 deposited in the third opening 34 may not fill (e.g., entirely fill) the third opening 34 if the third opening 34 has widths in the respective fourth and fifth directions that are greater than the first width W1.

In embodiments in which the insulating interlayer 20 includes the protrusion portions 25, and thus the third opening 34 may have the second width W2 in each of the fourth and fifth directions that is less than the first width W1 or less than the widths of the first and second openings 32 and 33. Accordingly, a void may not be formed in the third opening 34 during the deposition process, and the metal layer 40 may fill (e.g., entirely fill) the third opening 34.

A portion of the metal layer 40 on each of the first to third openings 32, 33 and 34 may have a concave upper surface, and thus an upper surface of a central portion of the metal layer 40 on each of the first to third openings 32, 33 and 34 may be lower than an upper surface of a portion of the metal layer 40 on the insulating interlayer 20.

If the metal layer 40 includes copper by performing an EP process, there may be no boundary surface in each of the first to third openings 32, 33 and 34.

Figure 5:
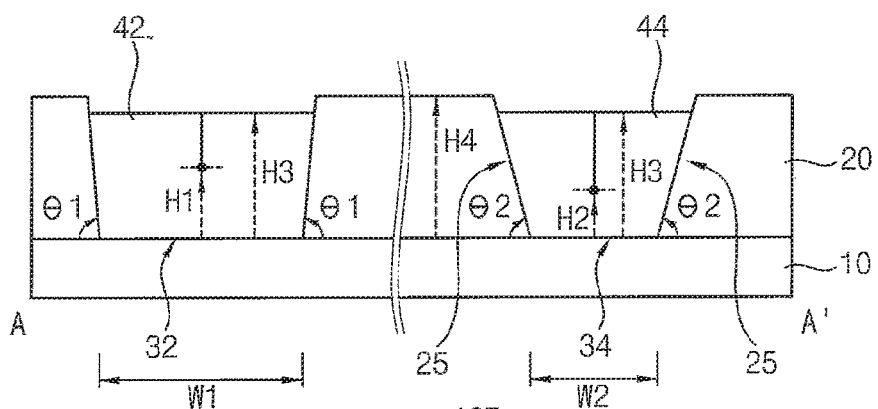
Figure 5:
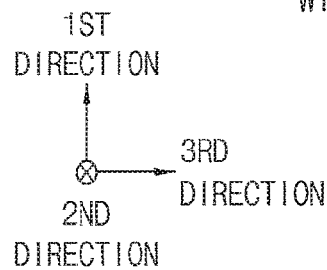
Figure 5:
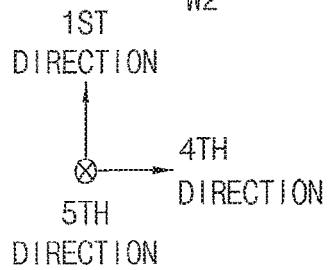

Referring to FIGS. 4 and 5, an upper portion of the metal layer 40 may be planarized until the upper surface of the insulating interlayer 20 is exposed, and thus first, second and third metal patterns 42, 43 and 44 may be formed in the first, second and third openings 32, 33 and 34, respectively.

In some example embodiments, the planarization process may include a chemical mechanical polishing (CMP) process and/or an etch back process.

In some example embodiments, each of the first to third metal patterns 42, 43 and 44 may have a flat upper surface, and a third height H3 of the upper surfaces of the first to third metal patterns 42, 43 and 44 may be less than a fourth height H4 of the upper surface of the insulating interlayer 20.

Figure 6:
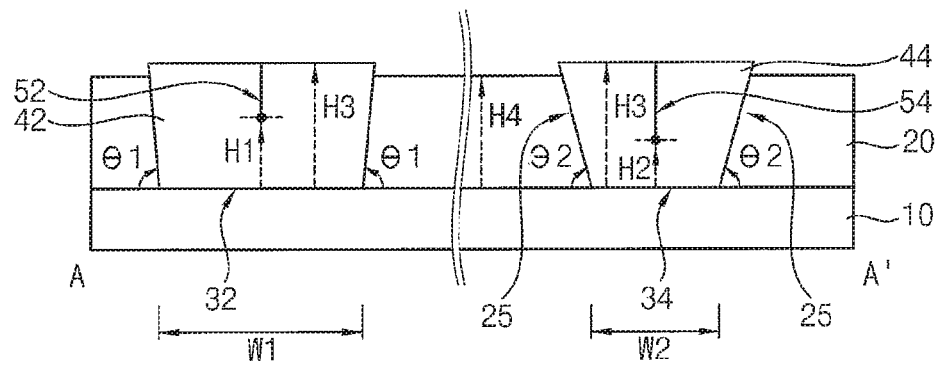
Figure 6:
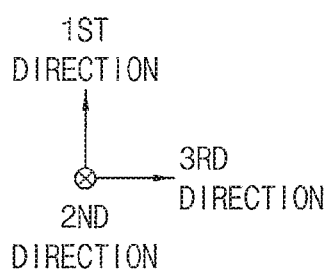
Figure 6:
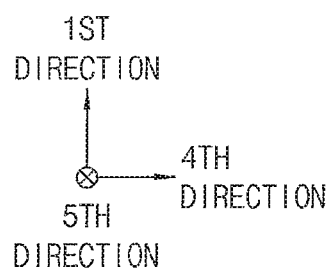

Alternatively, referring to FIG. 6, each of the first to third metal patterns 42, 43 and 44 may have a flat upper surface, and the third height H3 of the upper surfaces of the first to third metal patterns 42, 43 and 44 may be greater than the fourth height H4 of the upper surface of the insulating interlayer 20.

Although FIGS. 5 and 6 show the third height H3 as differing from the fourth height H4, the inventive concepts are not limited thereto, and the third height H3 may be substantially equal to the fourth height H4.

As illustrated above, the insulating interlayer 20 may include the protrusion portions 25, and thus the third opening 34 at an area where the first and second openings 32 and 33 having the first width W1 cross each other may have the second width W2 equal to or less than the first width W1. Thus, when the metal layer 40 is formed in the first to third openings 32, 33 and 34, the metal layer 40 formed in the third opening 34 may have no void therein and be free of such voids. Accordingly, the wiring structure including the first to third metal patterns 42, 43 and 44 in the first to third openings 32, 33 and 34, respectively, may have no or reduced failures due to the presence of such a void, and may have improved electrical characteristics.

Figure 7:
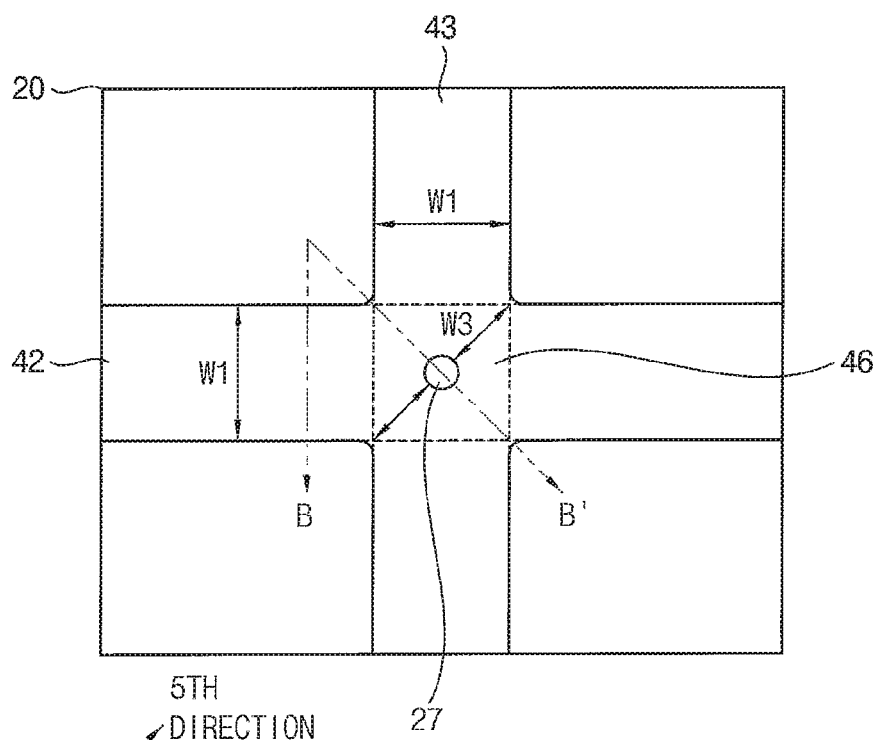
FIGS. 7 to 9 are a plan view and cross-sectional views illustrating a wiring structure in accordance with some example embodiments.
Figure 7:
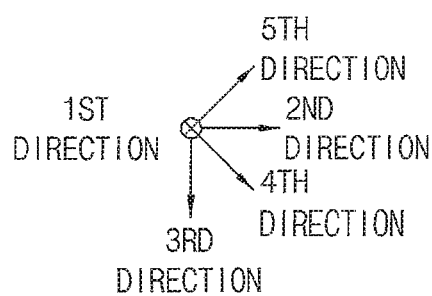
Figure 8:
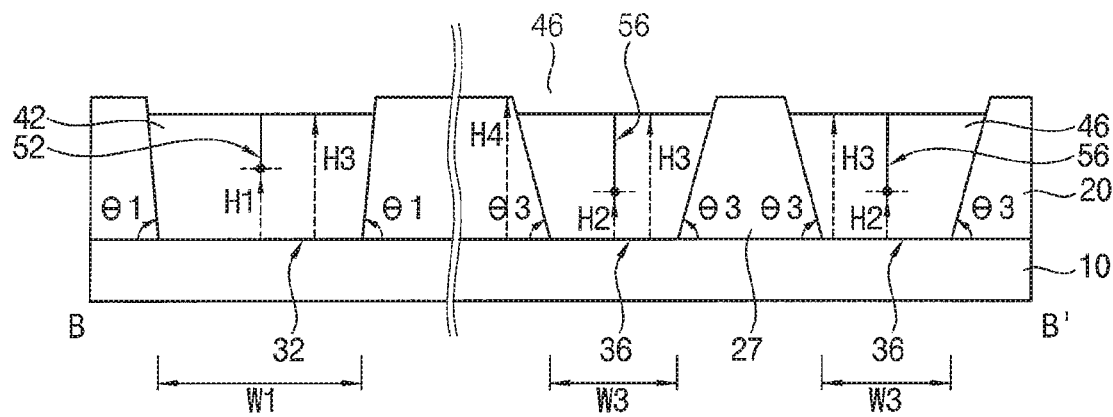
Figure 9:
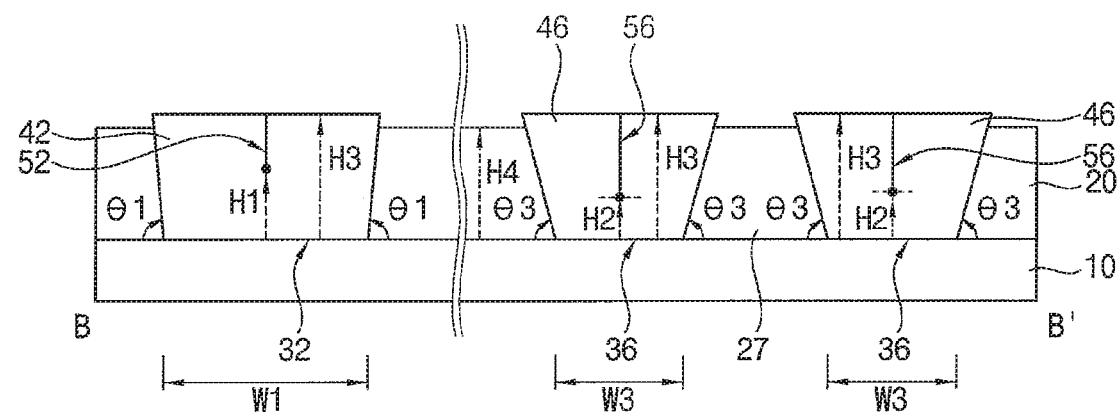

FIGS. 7 to 9 are a plan view and cross-sectional views illustrating a wiring structure in accordance with some example embodiments. Specifically, FIG. 7 is the plan view, and FIGS. 8 and 9 are cross-sectional views taken along a line B-B' of FIG. 7. A first portion of the line B-B' of FIG. 7 extends in the third direction, and a second portion of the line B-B' of FIG. 7 extends in the fourth direction. This wiring structure may be substantially the same as or similar to that of FIGS. 4 to 6, except for some elements described in greater detail below. Thus, like reference numerals refer to like elements, and detailed descriptions of previously described elements are not repeated herein in the interest of brevity.

Referring to FIGS. 7 and 8, an insulation spacer 27 may be formed in a fourth opening 36 at an area where the first and second openings 32 and 33 cross each other. The fourth opening 36 may have a shape of a rectangle or a substantially rectangular shape when viewed in a plan view, as in FIG. 7.

In some example embodiments, the insulation spacer 27 may be formed at a central portion of the fourth opening 36, and thus the insulation spacer 27 may be located at a third width W3 from each of vertices of the fourth opening 36 in each of the fourth and fifth directions. In some example embodiments, the third width W3 may be equal to less than the first width W1 of each of the first and second openings 32 and 33. The third width may be defined as the minimum distance between the insulating spacer 27 and the insulating interlayer 20 in the fourth and fifth directions. The insulation spacer 27 may have a shape of a circle, ellipse, polygon, etc., when viewed in a plan view. In some example embodiments, the insulation spacer 27 may be formed when the insulating interlayer 20 is formed, and thus the insulation spacer 27 may include a material that is substantially the same as that of the insulating interlayer 20. As best seen in FIG. 8, an upper surface of the insulation spacer 27 may have the fourth height H4 that is the height of the upper surface of the insulating interlayer 20. In other words, the upper surface of the insulation spacer 27 may be as far from the upper surface of the substrate 10 as the upper surface of the insulating interlayer 20.

If the insulation spacer 27 were not formed in the fourth opening 36, the fourth opening 36 may have a shape of a rectangle (with rounded vertices in some cases) in a plan view, and thus a width of the fourth opening 36 in each of the fourth and fifth directions may be greater than the first width W1. However, the insulation spacer 27 may be formed in the fourth opening 36, and thus the width of the fourth opening 36 in each of the fourth and fifth directions may be equal to or less than the first width W1.

In some example embodiments, the first angle θ1 of the sidewall of each of the first and second openings 32 and 33 with respect to the upper surface of the substrate 10 (e.g., the sidewalls of the openings having relatively larger widths, or the first width W1) may be greater than a third angle θ3 of a sidewall of the fourth opening 36 with respect to the upper surface of the substrate 10 (e.g., a sidewall of the opening having a relatively smaller width, or the third width W3).

In some example embodiments, the first and second metal patterns 42 and 43 in the first and second openings 32 and 33, respectively, may have the first boundary surface 52 and the second boundary surface (not shown), respectively. Each of the first boundary surface 52 and the second boundary surface may extend in the first direction. A fourth metal pattern 46 in the fourth opening 36 may have a fourth boundary surface 56, e.g., a seam that extends in the first direction. In some example embodiments, the first height H1 in the first direction of the bottom of the first boundary surface 52 or the second boundary surface may be greater than the second height H2 in the first direction of a bottom of the fourth boundary surface 56.

In some example embodiments, the insulation spacer 27 may be formed in the fourth opening 36, and thus the third width W3 of the fourth opening 36 in each of the fourth and fifth directions may be less than the first width W1. Accordingly, the fourth metal pattern 46 may fill (e.g., entirely fill) the fourth opening 36, without a void being formed therein.

In some example embodiments, each of the first, second and fourth metal patterns 42, 43 and 46 may have a flat upper surface, and the third height H3 of the upper surfaces of the first, second and fourth metal patterns 42, 43 and 46 may be less than the fourth height H4 of the upper surface of the insulating interlayer 20.

Alternatively, referring to FIG. 9, each of the first, second and fourth metal patterns 42, 43 and 46 may have the flat upper surface, and the third height H3 of the upper surfaces of the first, second and fourth metal patterns 42, 43 and 46 may be greater than the fourth height H4 of the upper surface of the insulating interlayer 20.

Although FIGS. 8 and 9 show the third height H3 as differing from the fourth height H4, the inventive concepts are not limited thereto, and the third height H3 of the upper surfaces of the first, second and fourth metal patterns 42, 43 and 46 may be substantially equal to the fourth height H4 of the upper surface of the insulating interlayer 20.

As illustrated above, the insulation spacer 27 may be formed in the fourth opening 36, and thus the fourth opening 36 at an area where the first and second openings 32 and 33 having the first width W1 cross each other may have the third width W3 equal to or less than the first width W1. Thus, the first, second and fourth openings 32, 33 and 36 may be filled (e.g., entirely filled) with the first, second and fourth metal patterns 42, 43 and 46, respectively, and no void may be formed therein, and the wiring structure including the first, second and fourth metal patterns 42, 43 and 46 may have improved electrical characteristics.

Figure 10A:
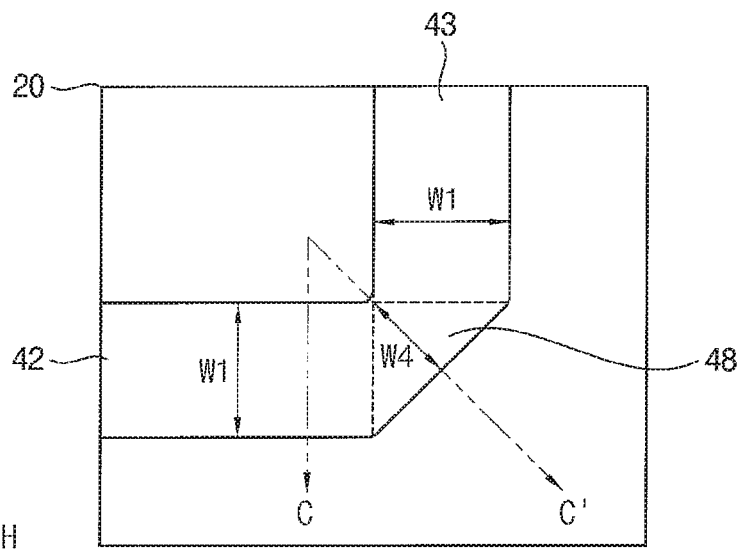
FIGS. 10A, 10B, 11 and 12 are plan views and cross-sectional views illustrating wiring structures in accordance with some example embodiments.
Figure 10B:
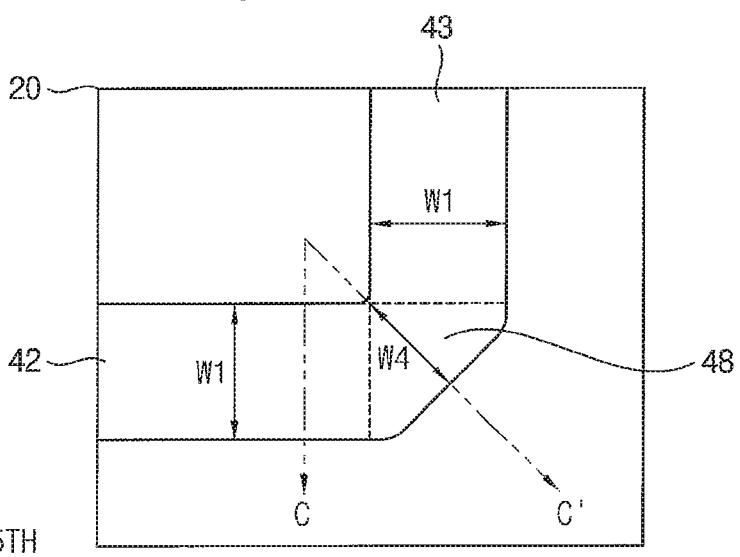
Figure 11:
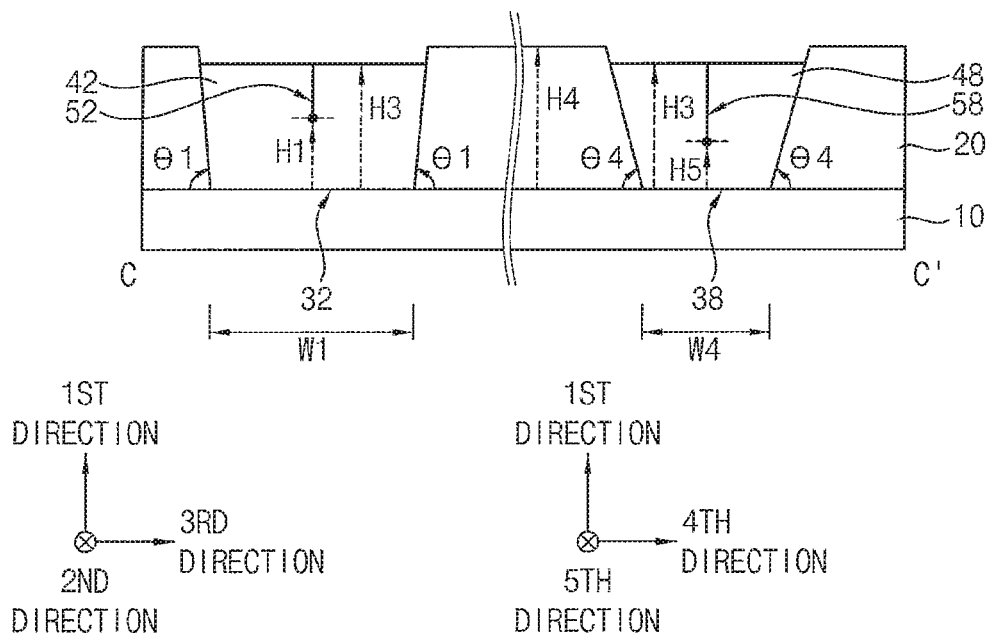
Figure 12:
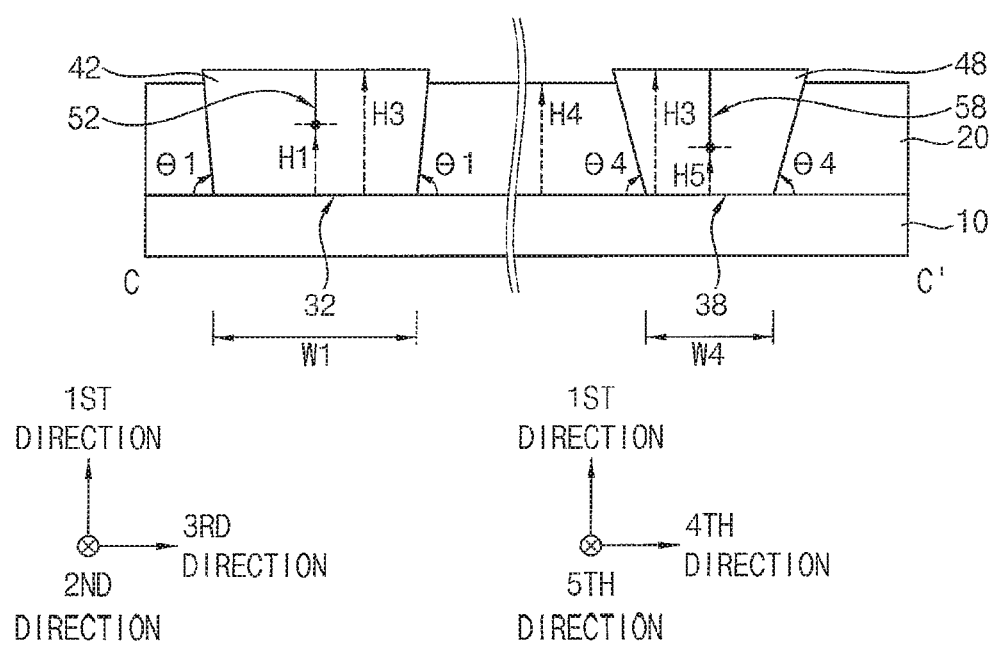

FIGS. 10A, 10B, 11 and 12 are plan views and cross-sectional views illustrating wiring structures in accordance with some example embodiments. Specifically, FIGS. 10A and 10B are plan views, and FIGS. 11 and 12 are cross-sectional views taken along a line C-C' of FIG. 10A or FIG. 10B. A first portion of the lines C-C' of FIGS. 10A and 10B extend in the third direction, and a second portion of the lines C-C' of FIGS. 10A and 10B extend in the fourth direction. These wiring structures may be substantially the same as or similar to that of FIGS. 4 to 6, except for some elements described in greater detail below. Thus, like reference numerals refer to like elements, and detailed descriptions of previously described elements are not repeated herein in the interest of brevity.

Referring to FIGS. 10A and 11, a fifth opening 38 may be formed at an area where an end portion in the second direction of the first opening 32 that extends in the second direction and an end portion in the third direction of the second opening 33 that extends in the third direction meet each other. The fifth opening 38 may be connected to both of the first and second openings 32 and 33.

In some example embodiments, the fifth opening 38 may have a shape of a triangle (with rounded vertices in some cases) when viewed in a plan view, and the fifth opening 38 may have a fourth width W4 in the fourth direction that extends from a vertex to an opposite side or edge of the fifth opening 38. The opposite edge may be a hypotenuse of the triangle shape of the fifth opening 38. The fourth width W4 may be equal to or less than the first width W1. The fourth width W4 may be defined as the minimum distance between the insulating interlayer 20 and the opposite edge of the fifth opening 38. That is, if the fifth opening 38 were, e.g., a shape of a rectangle, a width of the fifth opening 38 in the fourth direction may be greater than the first width W1, however, in some example embodiments, the fifth opening 38 may have the shape of a triangle, which may have a reduced area as compared to the rectangle, and thus the width of the fifth opening 38 in the fourth direction may be equal to or less than the first width W1.

In some example embodiments, the first angle θ1 of the sidewall of each of the first and second openings 32 and 33 with respect to the upper surface of the substrate 10 (e.g., the sidewalls of the openings having relatively larger widths, or the first width W1) may be greater than a fourth angle θ4 of a sidewall of the fifth opening 38 with respect to the upper surface of the substrate 10 (e.g., a sidewall of the opening having a relatively smaller width, or the fourth width W4).

In some example embodiments, the first and second metal patterns 42 and 43 in the first and second openings 32 and 33, respectively, may have the first boundary surface 52 and the second boundary surface (not shown), respectively. Each of the first boundary surface 52 and the second boundary surface may extend in the first direction. A fifth metal pattern 48 in the fifth opening 38 may have a fifth boundary surface 58, e.g., a seam that extends in the first direction. In some example embodiments, the first height H1 in the first direction of the bottom of the first boundary surface 52 or the second boundary surface may be greater than a fifth height H5 in the first direction of a bottom of the fifth boundary surface 58.

In some example embodiments, the fifth opening 38 may have the shape of the triangle, and thus the fifth opening 38 may have the fourth width W4 in the fourth direction less than the first width W1. Accordingly, the fifth metal pattern 48 may fill (e.g., entirely fill) the fifth opening 38, and no void may be formed therein.

In some example embodiments, each of the first, second and fifth metal patterns 42, 43 and 48 may have a flat upper surface, and the third height H3 of the upper surfaces of the first, second and fifth metal patterns 42, 43 and 48 may be less than the fourth height H4 of the upper surface of the insulating interlayer 20.

Alternatively, referring to FIG. 12, each of the first, second and fifth metal patterns 42, 43 and 48 may have the flat upper surface, and the third height H3 of the upper surfaces of the first, second and fourth metal patterns 42, 43 and 46 may be greater than the fourth height H4 of the upper surface of the insulating interlayer 20.

Although FIGS. 11 and 12 shown the third height H3 as differing from the fourth height H4, the inventive concepts are not limited thereto, and the third height H3 of the upper surfaces of the first, second and fifth metal patterns 42, 43 and 48 may be substantially equal to the fourth height H4 of the upper surface of the insulating interlayer 20.

Referring to FIG. 10B, the fifth opening 38 may have, when viewed in a plan view, a substantially triangular shape with at least one non-linear segment between two vertices thereof, which may resemble a rectangle from which a portion has been removed. The fourth width W4 may extend from a vertex to an opposite side in the fourth direction, and the fourth width W4 may be equal to or less than the first width W1.

As illustrated above, the fifth opening 38 at an area where the first and second openings 32 and 33 meet each other may have the shape of a triangle or a substantially triangular shape, and may have a fourth width W4 that is equal to or less than the widths of the first and second openings 32 and 33 (e.g., the first width W1). Thus, the first, second and fifth openings 32, 33 and 38 may be filled (e.g., entirely filled) with the first, second and fifth metal patterns 42, 43 and 48, respectively, and may have no void formed therein, and the wiring structure including the first, second and fifth metal patterns 42, 43 and 48 may have improved electrical characteristics.

Figure 13A:
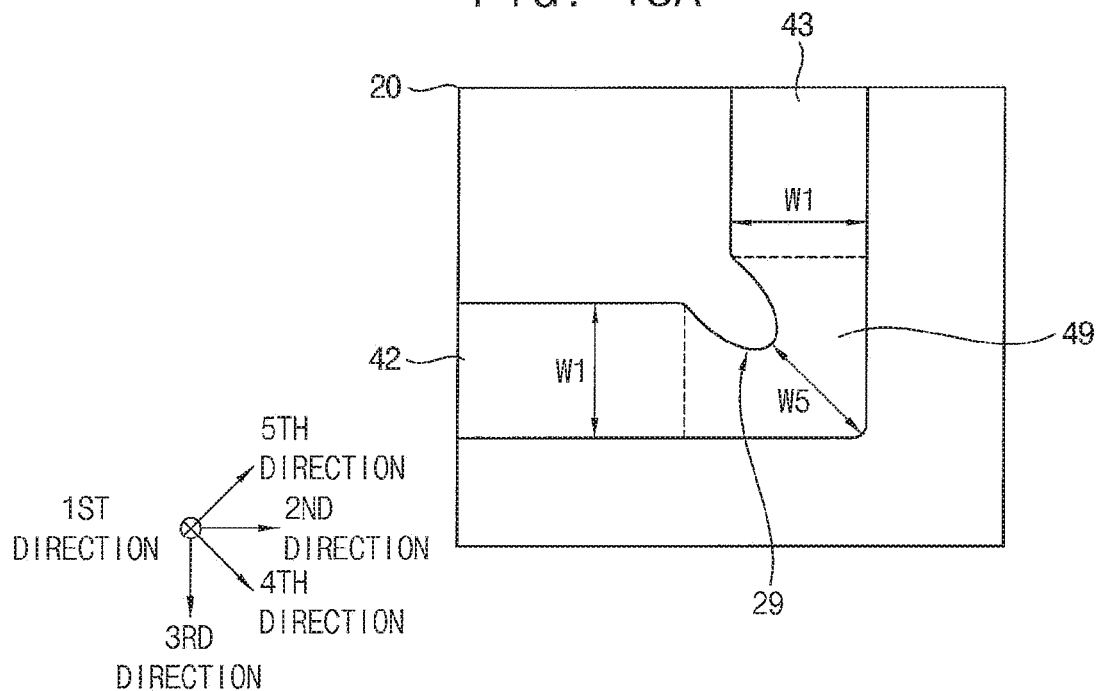
FIGS. 13A and 13B are plan views illustrating wiring structures in accordance with some example embodiments.
Figure 13B:
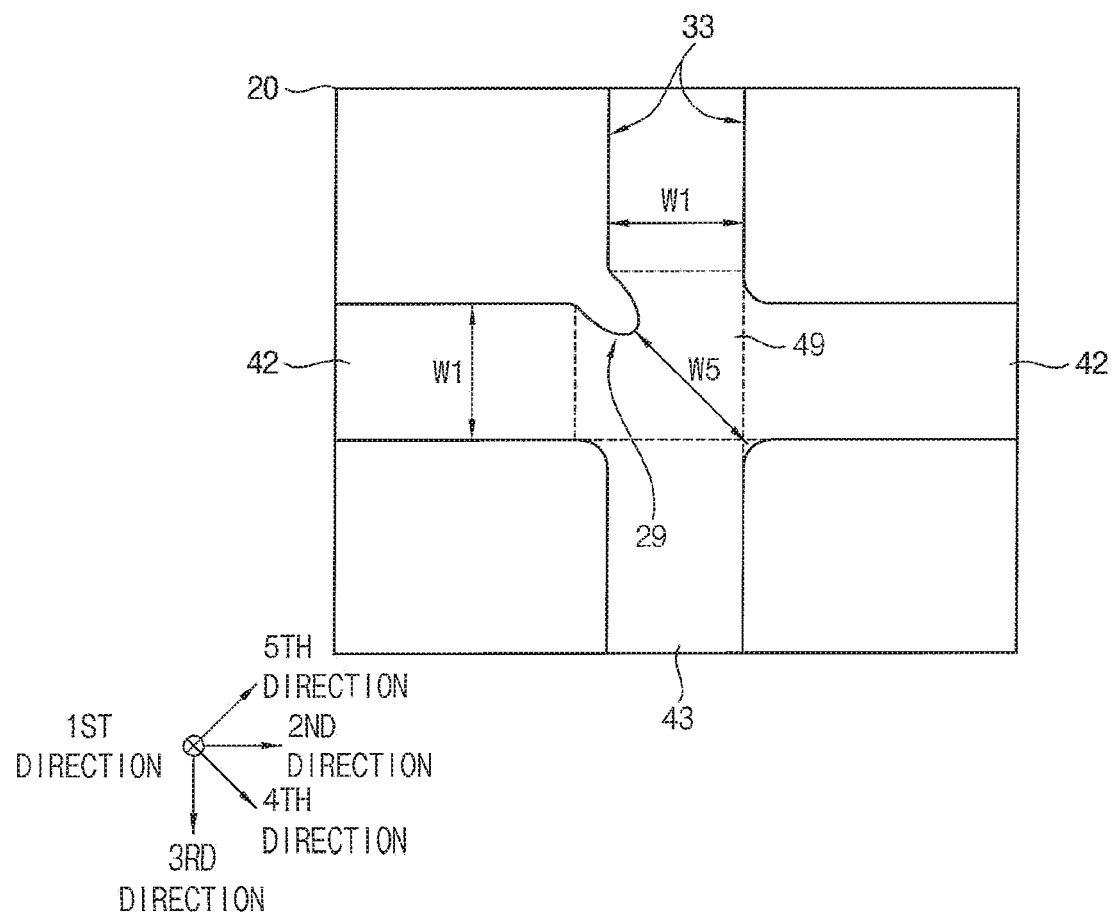

FIGS. 13A and 13B are plan views illustrating wiring structures in accordance with some example embodiments. These wiring structures may be substantially the same as or similar to that of FIGS. 10 to 12 or FIGS. 4 to 6, except for some elements described in greater detail below. Thus, like reference numerals refer to like elements, and detailed descriptions of previously described elements are not repeated herein in the interest of brevity.

Referring to FIG. 13A, the insulating interlayer 20 may include a protrusion portion 29 that protrudes toward a center of a sixth opening (not shown) at an area where the first and second openings 32 and 33, which extend in the second and third directions respectively, meet each other. The sixth opening may be filled with a sixth metal pattern 49. The sixth opening may have a shape of a rectangle having a concave portion in one quadrant thereof. In some example embodiments, the concave portion may be defined by a concave curve, edge, or arc segment, which may be elliptic or partially elliptic. The concave curve, edge, or arc segment may begin at a point adjacent to the first opening 32 and may extend to a point adjacent to the second opening 33.

In some example embodiments, a fifth width W5 that is a minimum width from the concave portion to a vertex of the sixth opening opposite the concave portion in the fourth direction may be equal to or less than the first width W1. That is, were the insulating interlayer 20 to not include the protrusion portion 29, a width of the sixth opening in the fourth direction may be greater than the first width W1. In some example embodiments, the insulating interlayer 20 does include the protrusion portion 29, and thus the minimum width of the sixth opening in the fourth direction may be equal to or less than the first width W1. Accordingly, the sixth opening may be filled (e.g., entirely filled) with a sixth metal pattern 49, and a void may not be formed therein.

The wiring structure may have characteristics, e.g., a height of a bottom of a sixth boundary surface (not shown) in the sixth metal pattern 49, a fifth angle (with respect to the upper surface of the substrate 10) of each of opposite sidewalls that form the minimum width, and a height of the sixth metal pattern 49, which may be substantially the same as those of the wiring structures illustrated with reference to FIGS. 10A, 10B, 11 and 12.

Referring to FIG. 13B, the insulating interlayer 20 may include the protrusion portion 29 protruding toward a center of a sixth opening located at an area where the first and second openings 32 and 33, which extend in the second and third directions respectively, meet each other, as that of FIG. 13A.

The first and second openings 32 and 33 of FIG. 13B, unlike those of FIG. 13A, may meet each other at the sixth opening, and may further extend in the second and third directions, respectively. As such, the first and second openings 32 and 33 of FIG. 13B may be similar to those of FIG. 1. Thus, the sixth opening, when viewed in a plan view, may have a shape of a rectangle having a concave portion in one quadrant thereof. In some example embodiments, the concave portion may be defined by a concave curve, edge, or arc segment, which may be elliptic or partially elliptic. The concave curve, edge, or arc segment may begin at a point adjacent to the first opening 32 and may extend to a point adjacent to the second opening 33.

The wiring structure may have characteristics, e.g., a height of a bottom of a sixth boundary surface in the sixth metal pattern 49, a fifth angle (with respect to the upper surface of the substrate 10) of each of opposite sidewalls that form the minimum width, and a height of the sixth metal pattern 49, which may be substantially the same as those of the wiring structure illustrated with reference to FIG. 13A.

As illustrated above, each of the wiring structures illustrated with reference to FIGS. 1 to 13B may include the first metal pattern 42 extending in the second direction and having the first width W1 in the third direction, the second metal pattern 43 extending in the second direction and having the first width W1 in the second direction (or having a different width in the second direction as discussed above), and one of the third to sixth metal patterns 44, 46, 48 and 49 that is formed at an area where the first and second metal patterns 42 and 43 meet or cross each other. The one of the third to sixth metal patterns 44, 46, 48 and 49 has a minimum width between opposite portions in the fourth direction having an angle of 45 degrees with respect to each of the second and third directions, and the minimum width may be equal to or less than the first width W1. The angle of the sidewall of the first metal pattern 42 in the third direction and/or the sidewall of the second metal pattern in the second direction with respect to the upper surface of the substrate 10, may be greater than the angle of each of the opposite sidewalls forming the minimum width in a corresponding one of the third to sixth metal patterns 44, 46, 48 and 49 with respect to the upper surface of the substrate 10. In other words, the first angle θ1 may be greater than a corresponding one of the second to fourth angles θ2, θ3 and θ4, and the fifth angle.

In some example embodiments, the heights of the bottoms of the first boundary surface 52 and the second boundary surface in the first and second metal patterns 42 and 43, respectively, may be greater than the height of the bottom of the corresponding one of the third to fifth boundary surfaces 54, 56 and 58 and the sixth boundary surface, which may be formed at the central portion in the fourth direction of the portion forming the minimum width in the corresponding one of the third to sixth metal patterns 44, 46, 48 and 49.

Figure 14:
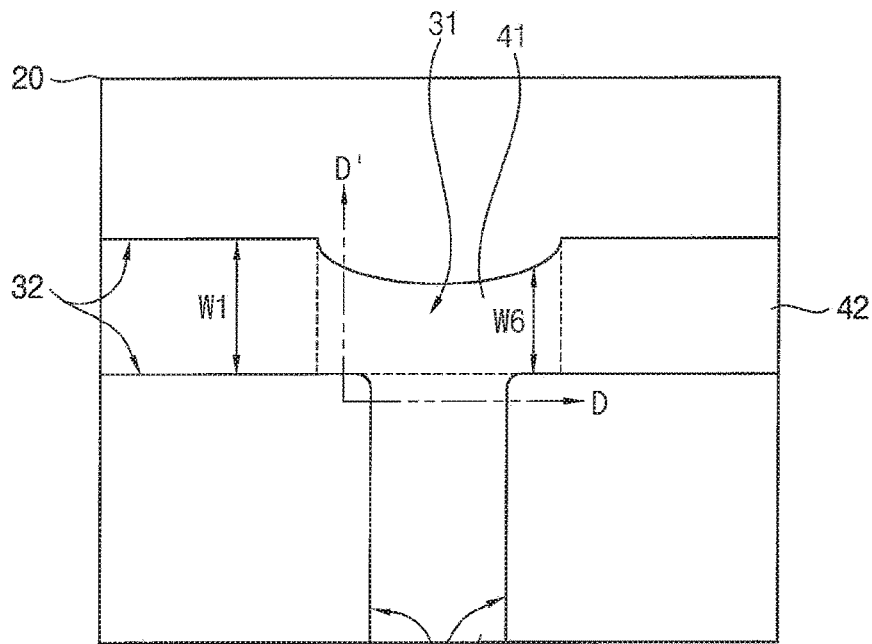
FIGS. 14, 15A, 15B, 16, 17A and 17B are plan views and cross-sectional views illustrating wiring structures in accordance with some example embodiments.
Figure 14:
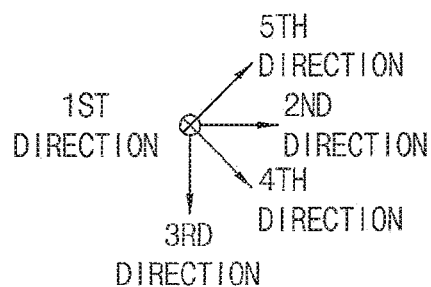
Figure 15A:
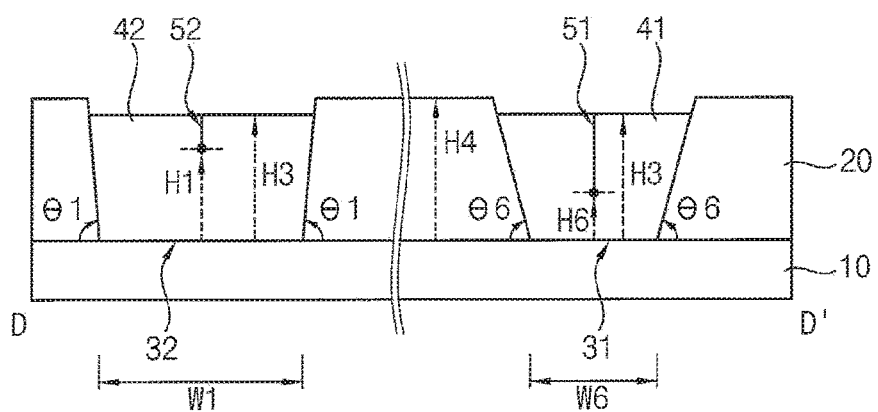
Figure 15A:
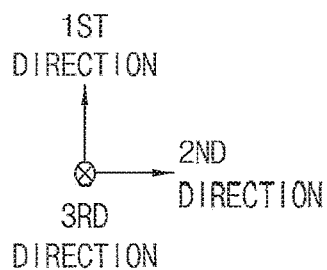
Figure 15A:
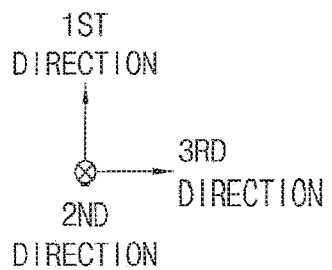
Figure 15B:
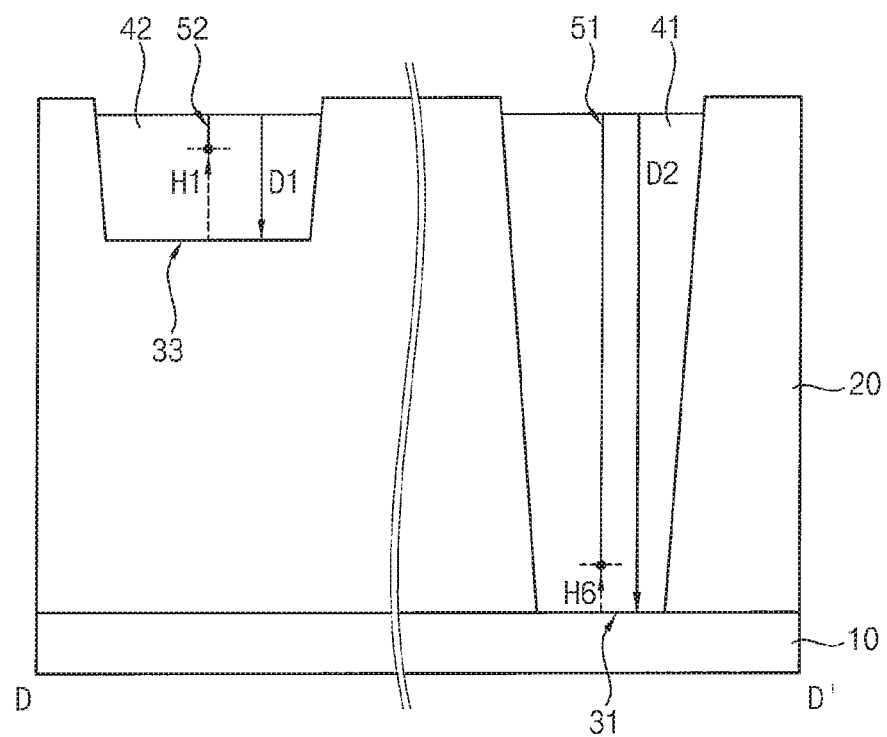
Figure 16:
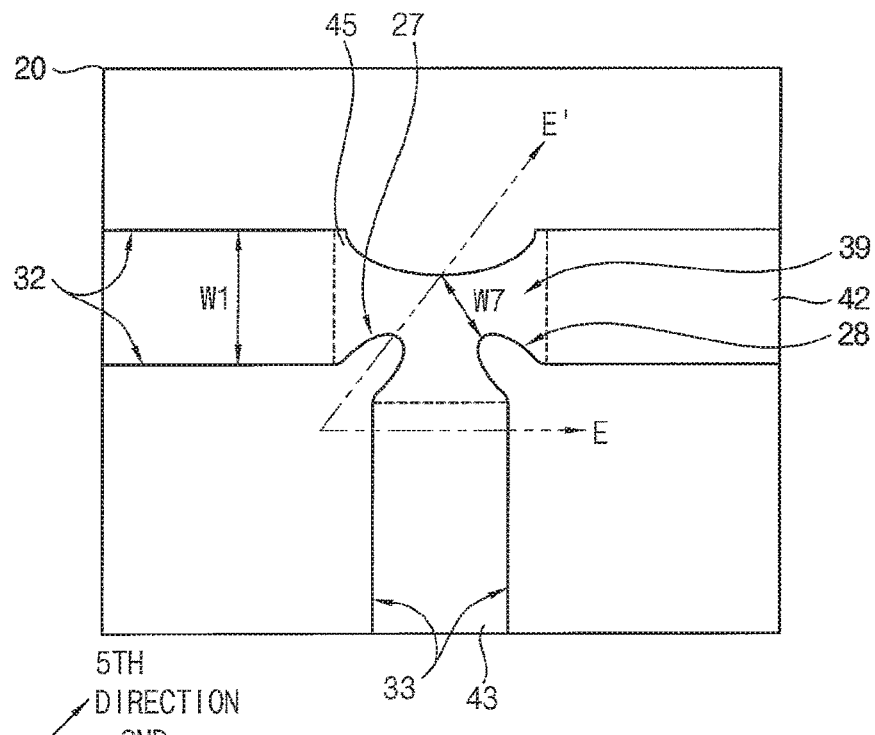
Figure 17A:
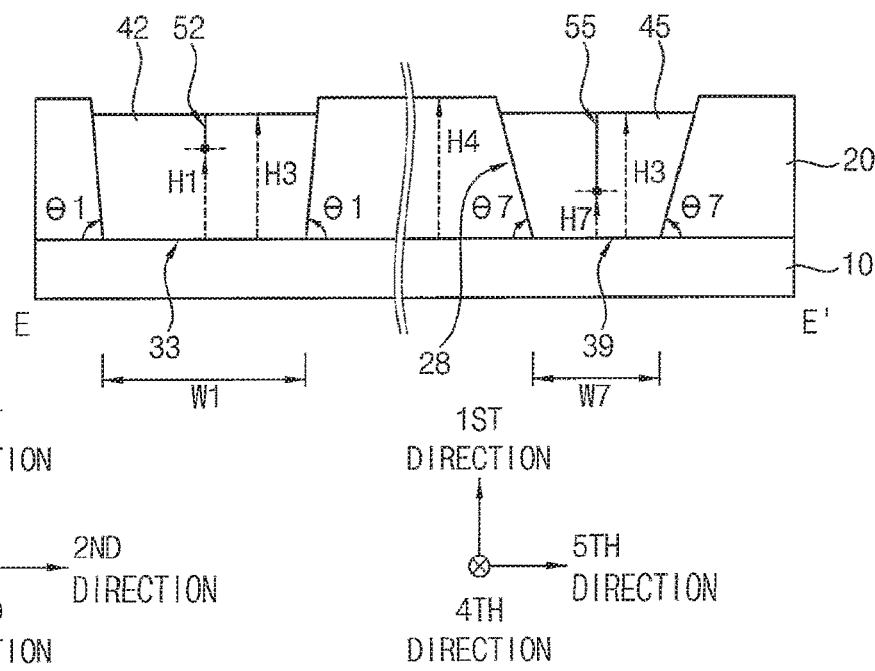
Figure 17B:
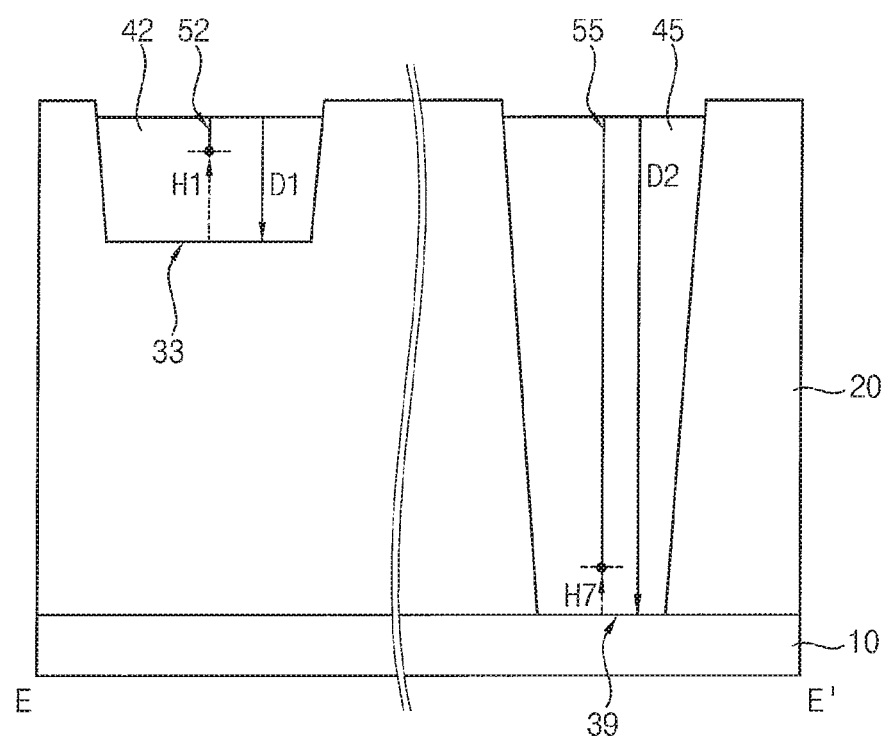

FIGS. 14, 15A, 15B, 16, 17A and 17B are plan views and cross-sectional views illustrating wiring structures in accordance with some example embodiments. Specifically, FIGS. 14 and 16 are plan views, FIGS. 15A and 15B are cross-sectional views taken along a line D-D' of FIG. 14, and FIGS. 17A and 17B are cross-sectional views taken along a line E-E' of FIG. 16. A first portion of the line D-D' of FIG. 14 extends in the second direction, and a second portion of the line A-A' of FIG. 1 extends in the third direction. A first portion of the line E-E' of FIG. 16 extends in the second direction, and a second portion of the line E-E' of FIG. 16 extends in the fifth direction. These wiring structures may be substantially the same as or similar to that of FIGS. 1 to 3, except for some elements described in greater detail below. Thus, like reference numerals refer to like elements, and detailed descriptions of previously described elements are not repeated herein in the interest of brevity.

Referring to FIGS. 14 and 15A, a seventh opening 31 may be formed at an area where a central portion in the second direction of the first opening 32 that extends in the second direction and an end portion in the third direction of the second opening 33 that extends in the third direction. The seventh opening 31 may be connected to the first and second openings 32 and 33.

In some example embodiments, the seventh opening 31 may have a shape of a rectangle with a concave portion at an upper portion thereof when viewed in a plan view, and thus a sixth width W6 in the third direction may be equal to or less than the first width W1. The sixth width W6 may be defined as the minimum width in the third direction between the concave portion of the seventh opening 31 and the insulating interlayer 20. In some example embodiments, the first angle θ1 of each of the first and second openings 32 and 33 with respect to the upper surface of the substrate 10 of the sidewall (e.g., the openings having relatively larger widths) may be greater than a sixth angle θ6 of a sidewall of the seventh opening 31 with respect to the upper surface of the substrate 10 (e.g., the opening having a relatively smaller width).

In some example embodiments, the first and second metal patterns 42 and 43 in the first and second openings 32 and 33, respectively, may have the first boundary surface 52 and the second boundary surface (not shown) that each extend in the first direction, and a seventh metal pattern 41 in the seventh opening 31 may have a seventh boundary surface 51, e.g., a seam that extends in the first direction. In some example embodiments, the first height H1 in the first direction of the bottom of the first boundary surface 52 or the second boundary surface may be greater than a sixth height H6 in the first direction of a bottom of the seventh boundary surface 51.

In some example embodiments, the seventh opening 31, when viewed in a plan view, may have the shape of the rectangle of which an upper portion is concave, and thus may have the sixth width W6 in the third direction that is less than the first width W1. Accordingly, the seventh opening 31 may be filled (e.g., entirely filled) with the seventh metal pattern 41, without a void being formed therein.

In some example embodiments, each of the first, second and seventh metal patterns 42, 43 and 41 may have a flat upper surface, and the third height H3 of the upper surfaces of the first, second and seventh metal patterns 42, 43 and 41 may be less than the fourth height H4 of the upper surface of the insulating interlayer 20.

Alternatively, each of the first, second and seventh metal patterns 42, 43 and 41 may have a flat upper surface, however, the third height H3 of the upper surfaces of the first, second and seventh metal patterns 42, 43 and 41 may be more than or equal to the fourth height H4 of the upper surface of the insulating interlayer 20.

Referring to FIG. 15B, in some example embodiments, a second depth D2 of the seventh opening 31 may be greater than a first depth D1 of the first and second openings 32 and 33, and thus a thickness of the seventh metal pattern 41 may be greater than that of the first and second metal patterns 42 and 43.

In some example embodiments, the first, second and seventh metal patterns 42, 43 and 41 in the first, second and seventh openings 32, 33 and 31, respectively, may have any one of a number of shapes. The seventh metal pattern 41 may be formed at an area where a central portion in the second direction of the first metal pattern 42 extending in the second direction and an end portion in the third direction of the second metal pattern 43 extending in the third direction meet each other. The For example, the seventh metal pattern 41 may have a shape, when viewed in a plan view, of a rectangle including first and second sides or edges opposite from each other in the third direction. The second side (which may not contact the second metal pattern 43) may not be a straight line, and may be in some embodiments a concave curve. The sixth width W6 between the first and second sides of the seventh metal pattern 41 may be equal to or less than the first width W1 of each of the first and second metal patterns 42 and 43.

Additionally, an insulation layer including an insulating material, e.g., silicon oxide instead of a metal may be formed in at least one of the first, second and seventh openings 32, 33 and 31, for example, in the seventh opening 31.

Referring to FIGS. 16 and 17A, an eighth opening 39 may be formed at an area where a central portion in the second direction of the first opening 32 that extends in the second direction meets an end portion in the third direction of the second opening 33 that extends in the third direction, like that of FIGS. 14 and 15A, and may have a concave edge at an upper side in a plan view.

Additionally, the insulating interlayer 20 may include at least one protrusion portion 28 protruding toward a center of the eighth opening 39. For example, the eighth opening 39 may have, when viewed in a plan view, a shape of a rectangle having a concave portion in at least one quadrant thereof. FIG. 16 shows two concave portions. In some example embodiments, the concave portion may be defined by a concave curve, edge, or arc segment, which may be elliptic or partially elliptic. The concave curve, edge, or arc segment may begin at a point adjacent to the first opening 32 and may extend to a point adjacent to the second opening 33.

In some example embodiments, a seventh width W7 from a point along the concave curve defining the concave portion that is nearest the center of the eighth opening 39 to the concave edge at the upper side of the rectangle in the fourth direction or the fifth direction may be equal to or less than the first width W1. Thus, the eighth opening 39 may be entirely filled with an eighth metal pattern 45 with no void therein.

In some example embodiments, the first angle θ1 of the sidewall of each of the first and second openings 32 and 33 with respect to the upper surface of the substrate 10 (that is, the openings having relatively larger widths) may be greater than a seventh angle θ7 of a sidewall of the eighth opening 39 with respect to the upper surface of the substrate 10 (that is, the opening having a relatively smaller width).

In some example embodiments, the first and second metal patterns 42 and 43 in the first and second openings 32 and 33, respectively, may have the first boundary surface 52 and the second boundary surface that each extend in the first direction, and the eighth metal pattern 45 in the eighth opening 39 may have an eighth boundary surface 55, e.g., a seam that extends in the first direction. In some example embodiments, the first height H1 in the first direction of the bottom of the first boundary surface 52 or the second boundary surface may be greater than a seventh height H7 in the first direction of a bottom of the eighth boundary surface 55.

Referring to FIG. 17B, the second depth D2 of the eighth opening 39 may be greater than the first depth D1 of the first and second openings 32 and 33, and thus a thickness of the eighth metal pattern 45 may be greater than that of the first and second metal patterns 42 and 43.

In some example embodiments, the first, second and eighth metal patterns 42, 43 and 45 in the first, second and eighth openings 32, 33 and 39, respectively, may have any one of a plurality of shapes. The eighth metal pattern 45 may be formed at an area where a central portion in the second direction of the first metal pattern 42 that extends in the second direction meets an end portion in the third direction of the second metal pattern 43 that extends in the third direction. The eighth metal pattern 45 may have a shape of a rectangle including first and second edges opposite from each other in the third direction in a plan view, however, the second edge not contacting the second metal pattern 43 may be a concave curve instead of a straight line. Additionally, concave portions may be present at opposite ends of the first edge of the rectangle may be concave. The seventh width W7, which may be a minimum distance between one of the concave portions at one of the opposite end portions of the first side and the concave second side of the rectangle in the fourth direction or the fifth direction, may be equal to or less than the first width W1.

Additionally, an insulation layer including an insulating material, e.g., silicon oxide instead of a metal may be formed in at least one of the first, second and eighth openings 32, 33 and 39, for example, in the eighth opening 39.

The wiring structures described with reference to FIGS. 1 to 17B may be formed via a damascene process or operation. Vertical memory devices including wiring structures with reference to FIGS. 1 to 17B, may be manufactured by one or more methods, and some example embodiments of methods of manufacturing the vertical memory device will be described hereinafter.

Hereinafter in the specifications (not necessarily in the claims), a direction substantially perpendicular to an upper surface of a first substrate may be defined as a first direction, and two directions substantially parallel to the upper surface of the first substrate and crossing each other may be defined as second and third directions, respectively. In some example embodiments, the second and third directions may be substantially perpendicular to each other.

Figure 18:
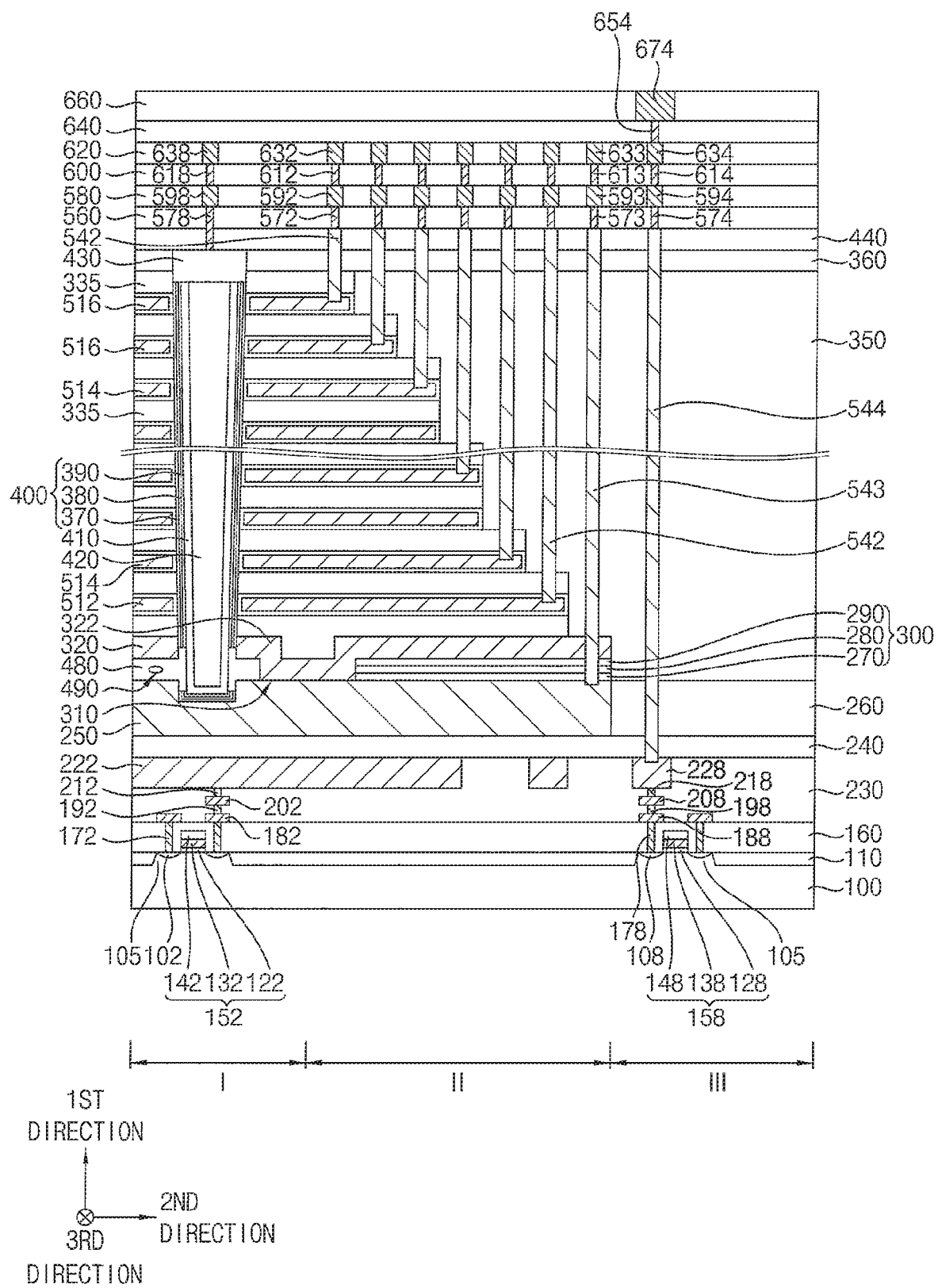
FIGS. 18 and 19 are cross-sectional views illustrating a vertical memory device in accordance with some example embodiments.
Figure 19:
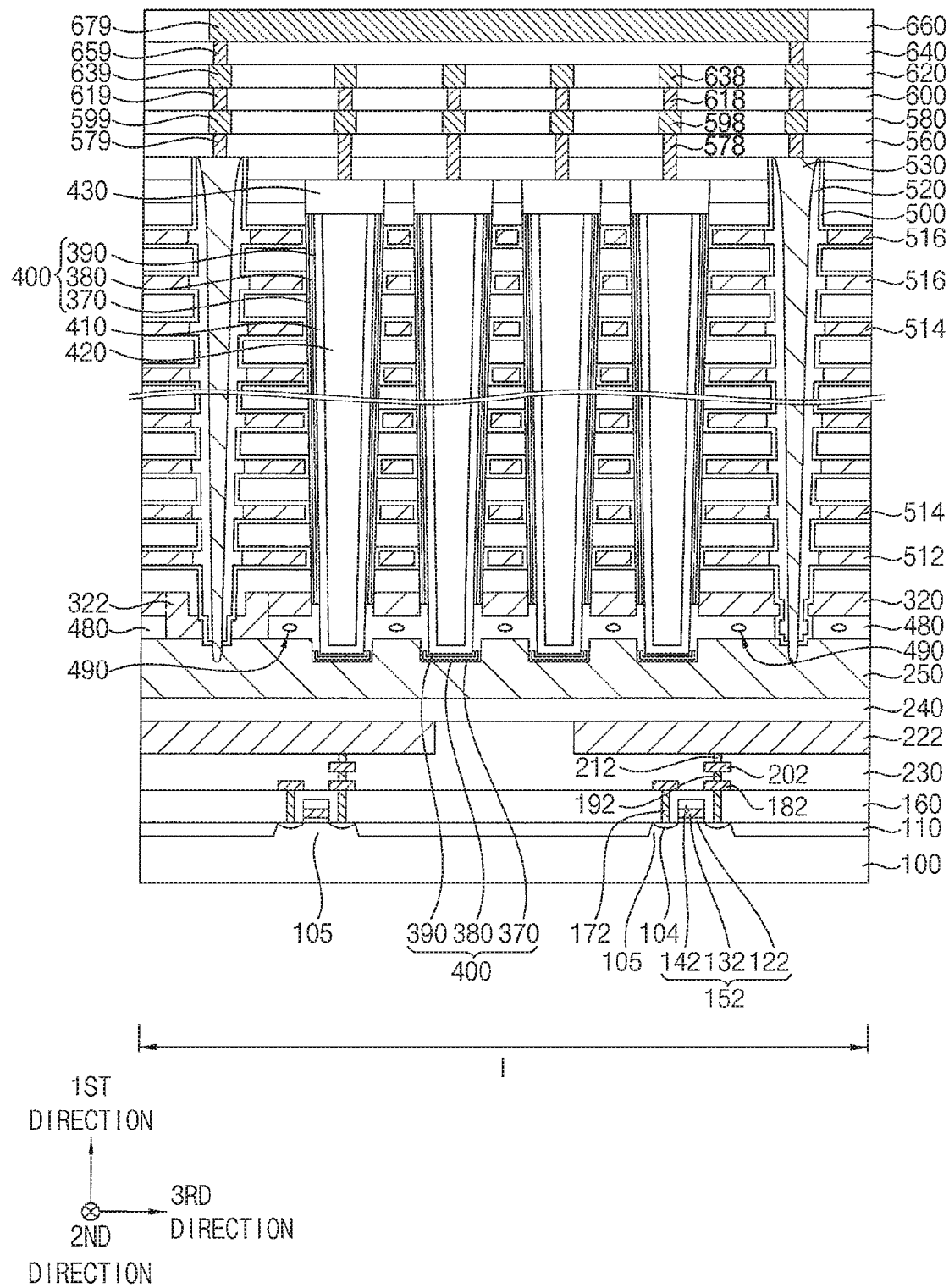

FIGS. 18 and 19 are cross-sectional views illustrating a vertical memory device in accordance with some example embodiments. Specifically, FIG. 18 is a cross-sectional view taken along the second direction, and FIG. 19 is a cross-sectional view taken along the third direction.

Referring to FIGS. 18 and 19, the vertical memory device may include lower circuit patterns on a first substrate 100, a second substrate 250 on the lower circuit patterns, a channel connection pattern 480, a support layer 320, a support pattern 322, a sacrificial layer structure 300 and memory cells on the second substrate 250, contact plugs 542, 543, 544 on the second substrate 250 and the lower circuit patterns, and upper circuit patterns. The vertical memory device may further include a division structure, first to third insulating interlayers 160, 230 and 240, a fourth insulating interlayer pattern 260, and fifth to thirteenth insulating interlayers 350, 360, 440, 560, 580, 600, 620, 640 and 660.

Each of the first and second substrates 100 and 250 may include semiconductor materials e.g., silicon, germanium, silicon-germanium, etc., or III-V compounds e.g., GaP, GaAs, GaSb, etc. In some example embodiments, each of the first and second substrates 100 and 250 may be a silicon-on-insulator (SOI) substrate or a germanium-on-insulator (GOI) substrate. In some example embodiments, the second substrate 250 may include polysilicon doped with n-type impurities.

The first substrate 100 may include a field region on which an isolation pattern 110 is formed, and an active region 105 on which no isolation pattern is formed. The isolation pattern 110 may include an oxide, e.g., silicon oxide.

In some example embodiments, the first substrate 100 may include first to third regions I, II and III. Hereinafter, each of the first to third regions I, II and III of the first substrate 100 may be referred to not only a portion of the first substrate 100 but also regions or spaces above the first substrate 100.

The first region I may be a cell array region in which memory cells are formed, the second region II may be an extension region or pad region that at least partially surrounds the first region I in which contact plugs are formed that are configured to transfer electrical signals to the memory cells and some of the upper circuit patterns electrically connected thereto, and the third region III may be a peripheral circuit region that at least partially surrounds the second region II and in which contact plugs are formed that are configured to transfer electrical signals to the lower circuit patterns and some of the upper circuit patterns electrically connected thereto.

The first and second regions I and II may form a cell region, and thus the peripheral circuit region may at least partially surround the cell region. FIG. 18 shows a portion of each of the first to third regions I, II and III of the first substrate 100.

In some example embodiments, the vertical memory device may have a cell-over-periphery (COP) structure. That is, the lower circuit patterns may be formed on the first substrate 100, and the memory cells, the contact plugs and the upper circuit patterns may be formed over the lower circuit patterns. The memory cells may be formed on the second substrate 250 in the first region I of the first substrate 100, and the contact plugs and the upper circuit patterns may be formed on the second substrate 250 in the second region II of the first substrate 100, or on the lower circuit patterns in the third region III of the first substrate 100.

The lower circuit patterns may include transistors, lower contact plugs, lower wirings, lower vias, etc. In some example embodiments, a first transistor including a first lower gate structure 152 and a first impurity region 102 at an upper portion of the active region 105 adjacent the first lower gate structure 152 in the first region I of the first substrate 100, and a second transistor including a second lower gate structure 158 and a second impurity region 108 at an upper portion of the active region 105 adjacent the second lower gate structure 158 in the third region III of the first substrate 100 may be formed. However, the inventive concepts are not limited thereto, and a lower gate structure and an impurity region may be formed in the second region II of the first substrate 100 to form an additional transistor.

The first lower gate structure 152 may include a first lower gate insulation pattern 122, a first lower gate electrode 132 and a first lower gate mask 142 sequentially stacked on the first substrate 100, and the second lower gate structure 154 may include a second lower gate insulation pattern 124, a second lower gate electrode 134 and a second lower gate mask 144 sequentially stacked on the first substrate 100.

The first insulating interlayer 160 may be formed on the first substrate 100 to cover the first and second transistors, and first and second lower contact plugs 172 and 178 may be formed through the first insulating interlayer 160 to contact the first and second impurity regions 102 and 108, respectively.

The lower wiring structure may include first to sixth lower wirings 182, 188, 202, 208, 222 and 228. The first and second lower wirings 182 and 188 may be formed on the first insulating interlayer 160 to contact upper surfaces of the first and second lower contact plugs 172 and 178, respectively. A first lower via 192, a third lower wiring 202, a third lower via 212 and a fifth lower wiring 222 may be sequentially stacked on the first lower wiring 182, and a second lower via 198, a fourth lower wiring 208, a fourth lower via 218 and a sixth lower wiring 228 may be sequentially stacked on the second lower wiring 188.

In some example embodiments, at least one of the first to sixth lower wirings 182, 188, 202, 208, 222 and 228 may have a structure substantially the same as that of one of the wiring structures illustrated with reference to FIGS. 1 to 17B, and thus may have improved electric characteristics with no void therein.

The first and second lower contact plugs 172 and 178, the first to fourth lower vias 192, 198, 212 and 218, and the first to sixth lower wirings 182, 188, 202, 208, 222 and 228 may include a conductive material, e.g., a metal, a metal nitride, a metal silicide, doped polysilicon, etc.

The second insulating interlayer 230 may be formed on the first insulating interlayer 160 to cover the first to fourth lower wirings 182, 188, 202 and 208 and the first to fourth lower vias 192, 198, 212 and 218 to surround sidewalls of the fifth and sixth lower wirings 222 and 228. The third insulating interlayer 240 may be formed on the second insulating interlayer 230, and the fifth and sixth lower wirings 222 and 228. The first to third insulating interlayers 160, 230 and 240 may form a lower insulating interlayer structure, and in some cases, may include a single layer because the first to third insulating interlayers 160, 230 and 240 may include the same material, e.g., silicon oxide and may be merged with each other.

The second substrate 250 may be formed on the third insulating interlayer 240 in the first and second regions I and II of the first substrate 100, and a sidewall of the second substrate 250 may be covered by the fourth insulating interlayer pattern 260 on the third insulating interlayer 240.

The fourth insulating interlayer pattern 260 may include an oxide, e.g., silicon oxide, and thus may be merged with the third insulating interlayer 240 in some cases.

The memory cells may be formed on the second substrate 250 in the first and second regions I and II of the first substrate 100. The memory cells may be arranged in the second and third directions to form a memory cell array. The memory cell array may include a plurality of memory cell blocks arranged in the third direction, which may be spaced apart from each other by the division structure extending in the second direction.

The division structure may include a common source pattern (CSP) 530 extending in the second direction on the second substrate 250 and a second spacer 520 on each of opposite sidewalls of the CSP 530. Alternatively, the CSP 530 may not be formed, and the division structure may include only the second spacer 520. The CSP 530 may include a metal, a metal nitride, a metal silicide, etc., and the second spacer 520 may include an oxide, e.g., silicon oxide.

In some example embodiments, the CSP 530 and/or the second spacer 520 may have a structure substantially the same as that of one of the wiring structures illustrated with reference to FIGS. 14 to 17B.

Each of the memory cell blocks may include a channel block therein. The channel block may include a plurality of channel columns each having a plurality of channels 410 arranged in the second direction.

Each of the memory cell blocks may include gate electrodes 512, 514 and 516 spaced apart from each other in the first direction, insulation patterns 335 between neighboring ones of the gate electrodes 512, 514 and 516, pillar structures each extending through the gate electrodes 512, 514 and 516 and the insulation patterns 335, and a capping pattern 430.

The gate electrodes 512, 514 and 516 may be formed in the first and second regions I and II of the first substrate 100 to be spaced apart from each other in the first direction, and each of the gate electrodes 512, 514 and 516 may extend in the second direction in the first and second regions I and II of the first substrate 100. Extension lengths in the second direction of the gate electrodes 512, 514 and 516 may decrease from a lowermost level toward an uppermost level, and thus the gate electrodes 512, 514 and 516 may have a staircase shape.

The gate electrodes 512, 514 and 516 may include a first gate electrode 512, a second gate electrode 514 and a third gate electrode 516 sequentially stacked in the first direction. The first gate electrode 512 may serve as a ground selection line (GSL), the second gate electrode 514 may serve as a word line, and the third gate electrode 516 may serve as a string selection line (SSL).

Each of the first to third gate electrodes 512, 514 and 516 may be formed at one level or a plurality of levels. In some example embodiments, the first gate electrode 512 may be formed at a lowermost level, the third gate electrode 516 may be formed at an uppermost level and a second level from above, and the second electrode 514 may be formed at a plurality of levels between the first and third gate electrodes 512 and 516.

Each of the gate electrodes 512, 514 and 516 may include a conductive pattern and a barrier pattern covering lower and upper surfaces and a sidewall of the conductive pattern. The conductive pattern may include a metal having a low resistance, e.g., tungsten, titanium, tantalum, platinum, etc., and the barrier pattern may include a metal nitride, e.g., titanium nitride, tantalum nitride, etc.

Sidewalls of the gate electrodes 512, 514 and 516 having the staircase shape may be covered by the fifth insulating interlayer 350, and the sixth to thirteenth insulating interlayers 360, 440, 560, 580, 600, 620, 640 and 660 may be sequentially stacked on an uppermost one of the insulation patterns 335 and the fifth insulating interlayer 350. The fifth to thirteenth insulating interlayers 350, 360, 440, 560, 580, 600, 620, 640 and 660 may include an oxide, e.g., silicon oxide, and may be merged with each other or with the fourth insulating interlayer pattern 260 in some example embodiments.

Lower and upper surfaces and a sidewall facing the channel 410 of each of the gate electrodes 512, 514 and 516 may be covered by a second blocking layer 500. The second blocking layer 500 may include a metal oxide, e.g., aluminum oxide, hafnium oxide, etc., and may also cover a sidewall of each of the insulation patterns 335.

Each of the pillar structures may include a charge storage structure 400, the channel 410 and a filling pattern 420, and the capping pattern 430 may be formed on each of the pillar structures.

The channel 410 may extend in the first direction on the second substrate 250, and may have a cup-like shape. The charge storage structure 400 may include an upper portion extending in the first direction to cover an outer sidewall of most portion of the channel 410 and a lower portion covering a bottom and a lower sidewall of the channel 410 on the second substrate 250. The filling pattern 420 may have a pillar shape for filling an inner space formed by the channel 410 having the cup-like shape.

The charge storage structure 400 may include a tunnel insulation pattern 390, a charge storage pattern 380 and a first blocking pattern 370 sequentially stacked from the outer sidewall of the channel 410 in a horizontal direction substantially parallel to the upper surface of the first substrate 100.

The channel 410 may include undoped or doped polysilicon or single crystalline silicon. The first blocking pattern 370 may include an oxide, e.g., silicon oxide, the charge storage pattern 380 may include a nitride, e.g., silicon nitride, and the tunnel insulation pattern 390 may include an oxide, e.g., silicon oxide. The filling pattern 420 may include an oxide, e.g., silicon oxide.

The capping pattern 430 may include, e.g., polysilicon or single crystalline silicon doped with impurities. The capping pattern 430 may extend through an upper portion of an uppermost one of the insulation patterns 335 and the sixth insulating interlayer 360.

The channel connection pattern 480 may be formed on the second substrate 250 in the first region I of the first substrate 100 to contact a lower outer sidewall of each of the channels 410, that is, an outer sidewall between the lower and upper portions of the charge storage structure 400, and thus the channels 410 included in each channel block may be connected with each other. The channel connection pattern 480 may include, e.g., polysilicon doped with n-type impurities, and may have an air gap 490 therein.

The sacrificial layer structure 300 may be formed on the second substrate 250 in the second region II of the first substrate 100, and may include first, second and third sacrificial layers 270, 280 and 290 sequentially stacked in the first direction. The first to third sacrificial layers 270, 280 and 290 may include an oxide, e.g., silicon oxide, a nitride, e.g., silicon nitride, and an oxide, e.g., silicon oxide, respectively.

In some example embodiments, the channel connection pattern 480 may fill a first gap 470 (refer to FIGS. 26 and 27) that may be formed by removing a portion of the sacrificial layer structure 300 in the first region I of the first substrate 100, and thus may be formed at the same level as the sacrificial layer structure 300.

The support layer 320 may be formed on the channel connection pattern 480 under the gate electrodes 512, 514 and 516 in the first region I of the first substrate 100. However, a portion of the support layer 320 may extend through the channel connection pattern 480 or the sacrificial layer structure 300 to contact an upper surface of the second substrate 250, which may be referred to as a support pattern 322. In some example embodiments, a plurality of support patterns 322 may be formed in the first and second regions I and II of the first substrate 100, and may have various layouts. For example, a plurality of support patterns 322 may be spaced apart from each other in the second and third directions, and some of the support patterns 322 may extend in the second direction or the third direction.

The first contact plug 542 may extend through the fifth to seventh insulating interlayers 350, 360 and 440, the insulation patterns 335 and the second blocking pattern 500 to contact a corresponding one of the first to third gate electrodes 512, 514 and 516 in the second region II of the first substrate 100, the second contact plug 543 may extend through fifth to seventh insulating interlayers 350, 360 and 440, the support layer 320 and the sacrificial layer structure 300 to contact an upper surface of the second substrate 250 in the second region II of the first substrate 100, and the third contact plug 544 may extend through fifth to seventh insulating interlayers 350, 360 and 440, the sacrificial layer structure 300, the fourth insulating interlayer pattern 260 and the third insulating interlayer 240 to contact an upper surface of the sixth lower wiring 228 in the third region III of the first substrate 100.

The third contact plug 544 may extend in the first direction to electrically connect the lower circuit patterns with the upper circuit patterns, and thus may be referred to as a through hole via (THV).

The upper circuit patterns may include, upper contact plugs upper wirings, upper vias, etc.

The first, second, third and fifth upper contact plugs 572, 573, 574 and 579 may extend through the eighth insulating interlayer 560 on the seventh insulating interlayer 440, the division structure, and the first to third contact plugs 542, 543 and 544 to contact upper surfaces of the first, second and third contact plugs 542, 543 and 544 and the CSP 530, respectively, and the fourth upper contact plug 578 may extend through the seventh and eighth insulating interlayers 440 and 560 to contact an upper surface of the capping pattern 430.

The upper wiring structures may include, for example, first to twelfth upper wirings 592, 593, 594, 598, 599, 632, 633, 634, 638, 639, 674, 679. The first to fifth upper wirings 592, 593, 594, 598, 599 may extend through the ninth insulating interlayer 580 on the eighth insulating interlayer 560 and the first to fifth upper contact plugs 572, 573, 574, 578, 579 to contact upper surfaces of the first to fifth upper contact plugs 572, 573, 574, 578, 579, respectively.

The first to fifth upper wirings 612, 613, 614, 618, 619 may extend through the tenth insulating interlayer 600 on the ninth insulating interlayer 580 and the first to fifth upper wirings 592, 593, 594, 598 and 599 to contact upper surfaces of the first to fifth upper wirings 592, 593, 594, 598 and 599, respectively.

The sixth to tenth upper wirings 632, 633, 634, 638 and 639 may extend through the eleventh insulating interlayer 620 on the tenth insulating interlayer 600 and the first to fifth upper wirings 612, 613, 614, 618 and 619 to contact upper surfaces of the first to fifth upper wirings 612, 613, 614, 618 and 619, respectively.

The sixth and seventh upper vias 654 and 659 may extend through the twelfth insulating interlayer 640 on the eleventh insulating interlayer 620 and the sixth to tenth upper wirings 632, 633, 634, 638 and 639 to contact upper surfaces of the eighth to tenth upper wirings 634, 638 and 639, respectively.

The eleventh and twelfth upper wirings 674 and 679 may extend through the thirteenth insulating interlayer 660 on the twelfth insulating interlayer 640 and the sixth and seventh upper vias 654 and 659 to contact upper surfaces of the sixth and seventh upper vias 654 and 659, respectively.

In some example embodiments, the ninth upper wiring 638 may extend in the third direction, and a plurality of ninth upper wirings 638 may be spaced apart from each other in the second direction. The ninth upper wiring 638 may serve as a bit line of the vertical memory device.

In some example embodiments, at least one of the first to twelfth upper wirings 592, 593, 594, 598, 599, 632, 633, 634, 638, 639, 674, 679 may have a structure substantially the same as that of one of the wiring structures illustrated with reference to FIGS. 1 to 17, and thus may have improved electric characteristics having no void therein.

FIGS. 20 to 32 are cross-sectional views illustrating methods of manufacturing vertical memory devices in accordance with some example embodiments. Specifically, FIGS. 20-24, 26, 28, 30 and 32 are cross-sectional views taken along the second direction, and FIGS. 25, 27, 29 and 31 are cross-sectional views taken along the third direction.

Figure 20:
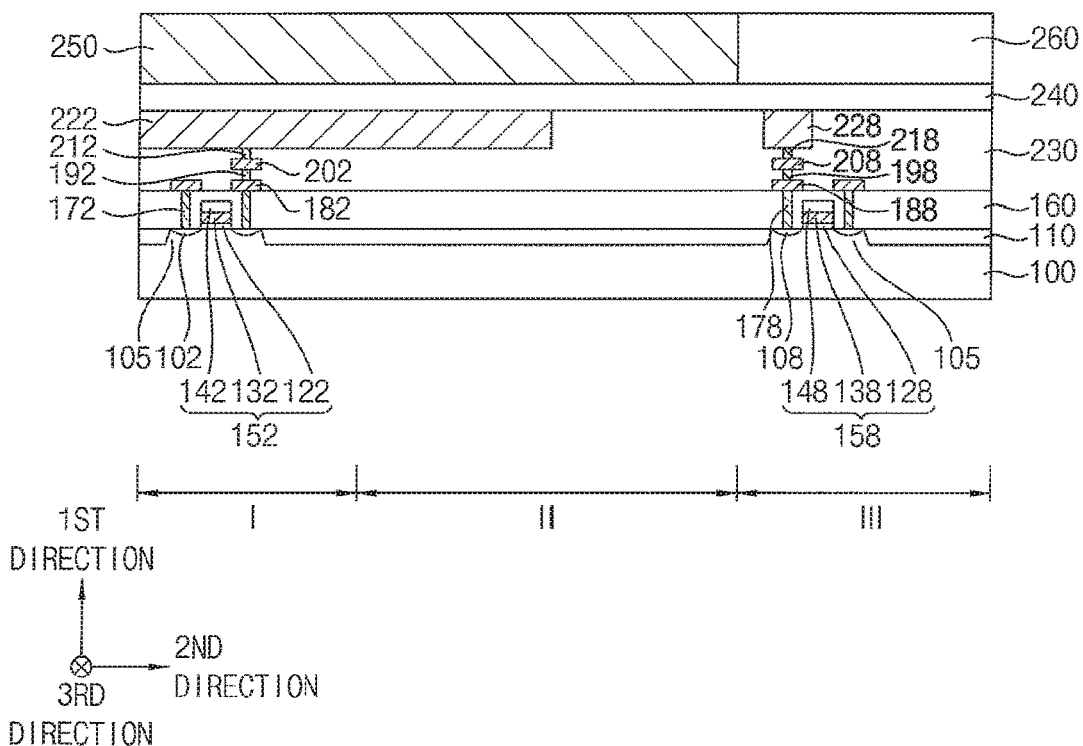
FIGS. 20 to 32 are cross-sectional views illustrating a method of manufacturing a vertical memory device in accordance with some example embodiments.

Referring to FIG. 20, lower circuit patterns may be formed on a first substrate 100, and first to third insulating interlayers 160, 230 and 240 may be sequentially formed on the first substrate 100 to cover the lower circuit patterns.

An isolation pattern 110 may be formed on the first substrate 100 by a shallow trench isolation (STI) process, and an active region 105 may be defined in the first substrate 100. An ion implantation process may be performed to form first and second impurity regions 102 and 108 at upper portions of the active region 105. First and second lower gate structures 152 and 158, first and second lower contact plugs 172 and 178, first to fourth lower vias 192, 198, 212 and 218, and first to sixth lower wirings 182, 188, 202, 208, 222 and 228, which may form the lower circuit patterns, may be formed by a patterning process or a damascene process. Particularly, the first to sixth lower wirings 182, 188, 202, 208, 222 and 228 may be formed by a damascene process as illustrated with respect to FIGS. 1 to 17B, and thus avoid the formation of a void therein, which may provide improved electric characteristics.

The first insulating interlayer 160 may be formed on the first substrate 100, and may cover the first and second impurity regions 102 and 108 and the first and second lower gate structures 152 and 158 to surround sidewalls of the first and second lower contact plugs 172 and 178. The second insulating interlayer 230 may be formed on the first insulating interlayer 160, and may cover the first to fourth lower vias 192, 198, 212 and 218 and the first to fourth lower wirings 182, 188, 202 and 208 to surround sidewalls of the fifth and sixth lower wirings 222 and 228. The third insulating interlayer 240 may be formed on the fifth and sixth lower wirings 222 and 228.

A second substrate 250 may be formed on the third insulating interlayer 240, and a fourth insulating interlayer pattern 260 may be formed on the third insulating interlayer 240 to cover a sidewall of the second substrate 250.

The second substrate 250 may be formed on the third insulating interlayer 240, and may be patterned by an etching process to remain only in the first and second regions I and II of the first substrate 100.

The fourth insulating interlayer pattern 260 may be formed by forming a fourth insulating interlayer on the third insulating interlayer 240 to cover the second substrate 250, and planarizing the fourth insulating interlayer until an upper surface of the second substrate 250 is exposed.

Figure 21:
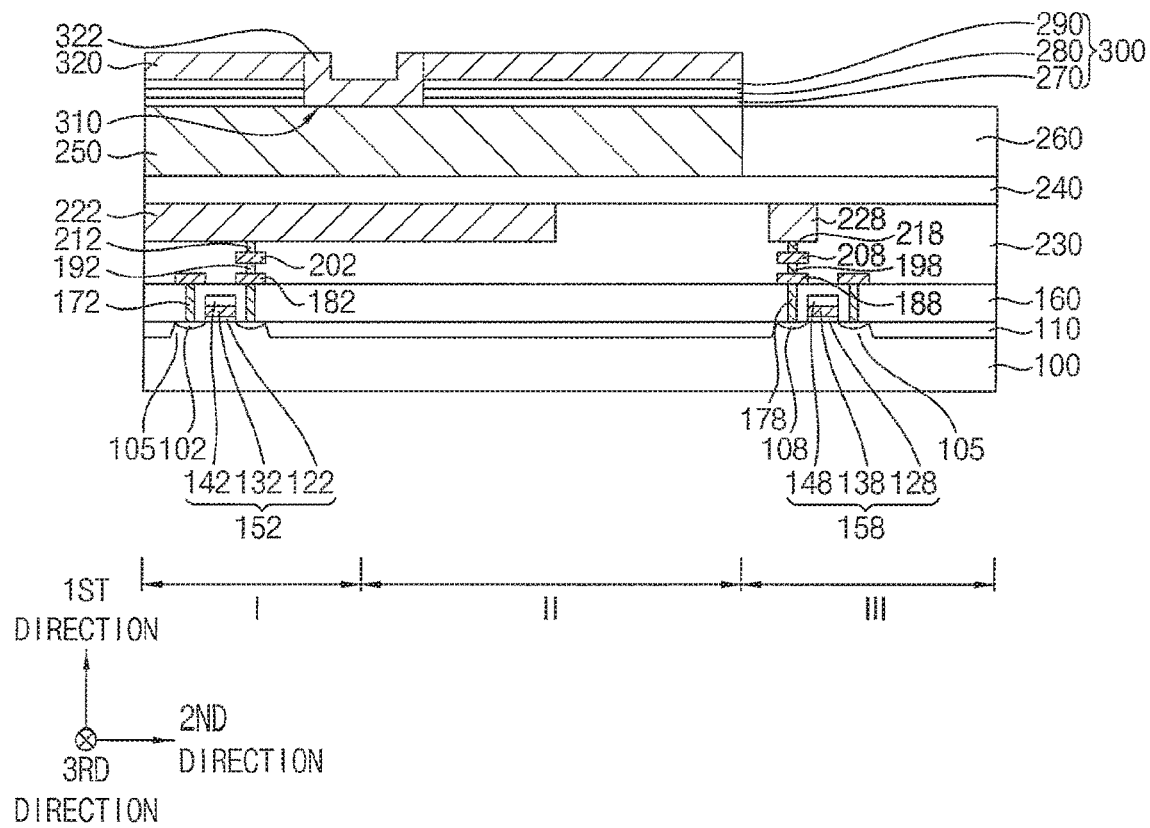

Referring to FIG. 21, a sacrificial layer structure 300 may be formed on the second substrate 250 and the fourth insulating interlayer pattern 260, the sacrificial layer structure 300 may be partially removed to form a ninth opening 310 exposing an upper surface of the second substrate 250, and a support layer 320 may be formed on the second substrate 250 and the fourth insulating interlayer pattern 260 to at least partially fill the ninth opening 310.

The sacrificial layer structure 300 may include first to third sacrificial layers 270, 280 and 290 sequentially stacked.

In some example embodiments, a plurality of ninth openings 310 may be formed in the first and second regions I and II of the first substrate 100, and may have various layouts. For example, a plurality of ninth openings 310 may be formed to be spaced apart from each other in the second and third directions, and some of the ninth openings 310 may extend in the second direction or the third direction.

The support layer 320 may have a constant thickness, and thus a first recess may be formed on a portion of the support layer 320 in the ninth opening 310. Hereinafter, the portion of the support layer 320 in the ninth opening 310 may be referred to as a support pattern 322.

Portions of the sacrificial layer structure 300 and the support layer 320 in the third region III of the first substrate 100 may be patterned.

Figure 22:
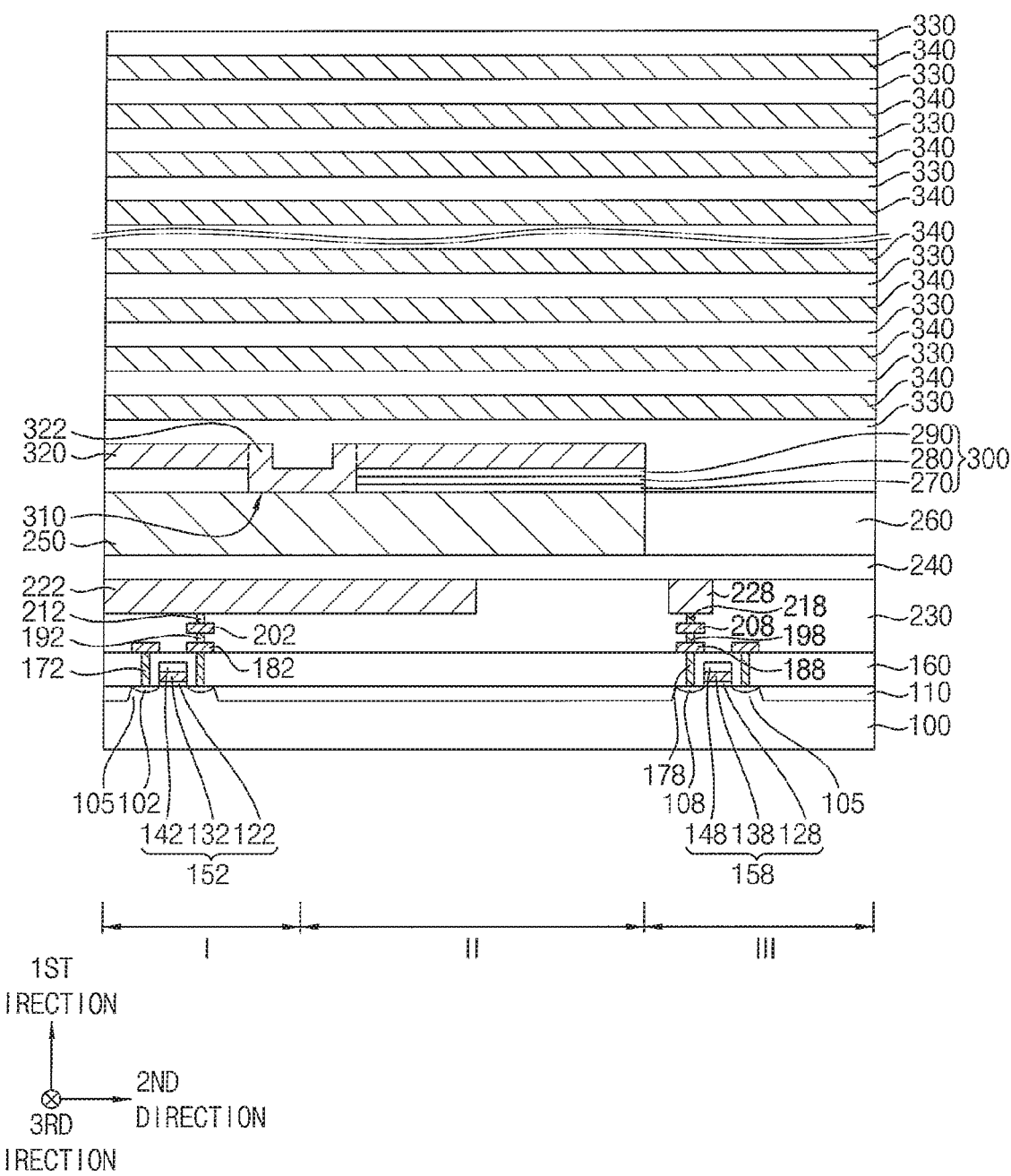

Referring to FIG. 22, an insulation layer 330 may be formed on the support layer 320, the support pattern 322 and the fourth insulating interlayer pattern 260 to fill the first recess, and an upper portion of the insulation layer 330 may be planarized.

A fourth sacrificial layer 340 and the insulation layer 330 may be alternately and repeatedly stacked on the insulation layer 330. Accordingly, a mold layer including a plurality of insulation layers 330 and a plurality of fourth sacrificial layers 340 which are alternately and repeatedly stacked in the first direction may be formed on the support layer 320, the insulation pattern 322 and the fourth insulating interlayer pattern 260. The fourth sacrificial layer 340 may include a material having an etching selectivity with respect to the insulation layer 330, e.g., a nitride such as silicon nitride.

Figure 23:
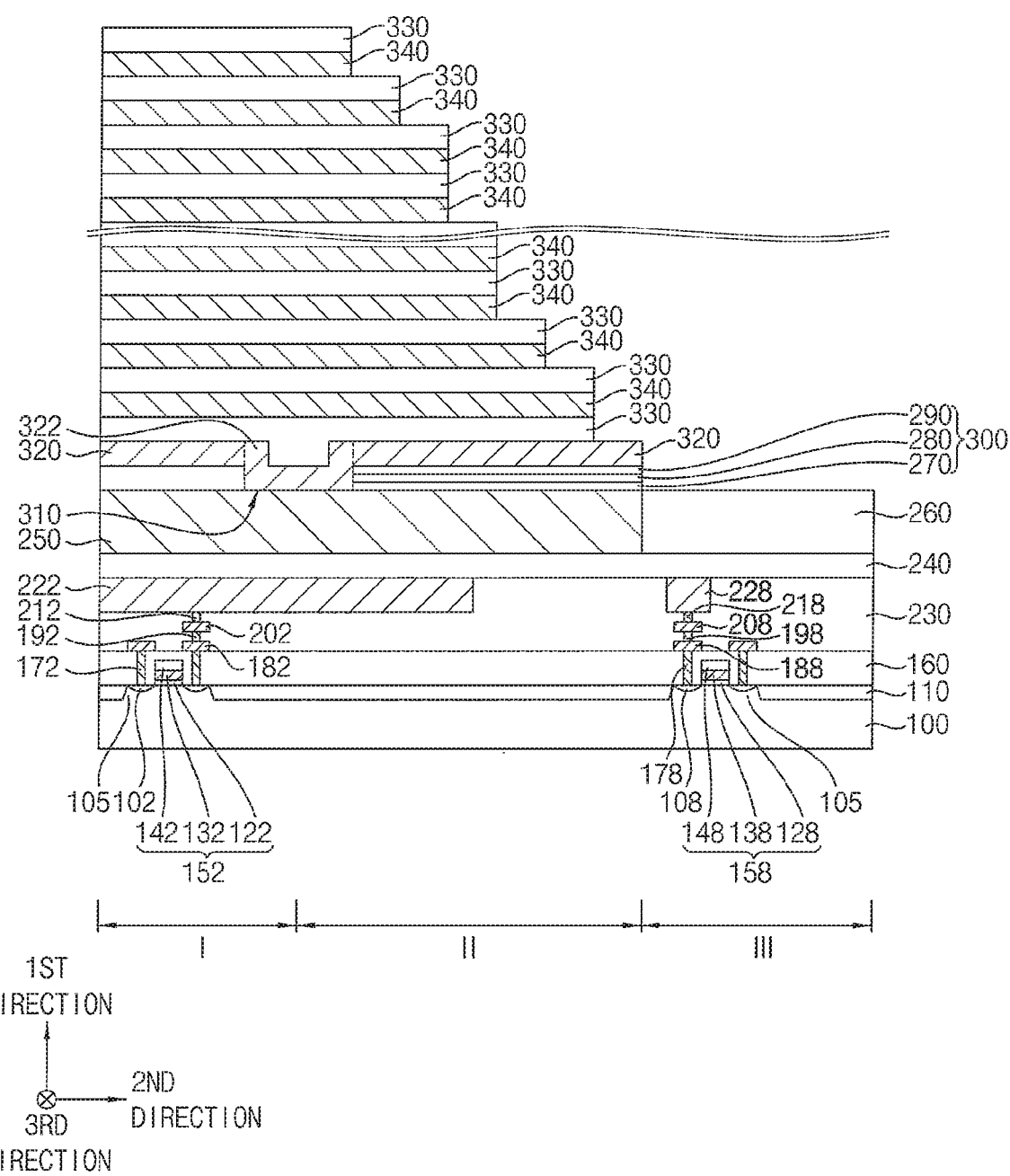

Referring to FIG. 23, a photoresist pattern (not shown) partially covering an uppermost one of the insulation patterns 330 may be formed thereon, and the uppermost one of the insulation layers 330, and an uppermost one of the fourth sacrificial layers 340 thereunder may be etched using the photoresist pattern as an etching mask. Accordingly, a portion of one of the insulation layers 330 directly under the uppermost one of the fourth sacrificial layers 340 may be exposed. After a trimming process for reducing an area of the photoresist pattern by a given ratio is performed, an etching process may be performed such that the uppermost one of the insulation layers 330, the uppermost one of the fourth sacrificial layers 340, the exposed one of the insulation layers 330 and one of the fourth sacrificial layers 340 thereunder may be etched using the reduced photoresist pattern as an etching mask.

As the trimming process and the etching process are repeatedly performed, a mold including a plurality of step layers which may include one fourth sacrificial layer 340 and one insulation layer 330 sequentially stacked and having a staircase shape may be formed in the first and second regions I and II of the first substrate 100. Each of the "step layers" may be considered to include not only an exposed portion, but also a portion thereof covered by upper step layers, and thus may refer to an entire portion of the fourth sacrificial layer 340 and an entire portion of the insulation layer 330 at each level. The exposed portion of the step layer not covered by upper step layers may be referred to as a "step." In some example embodiments, the steps may be arranged in the second direction and/or in the third direction in the second region II of the first substrate 100.

As the mold is formed, the fourth insulating interlayer pattern 260 in the third region III of the first substrate 100 may be exposed.

Figure 24:
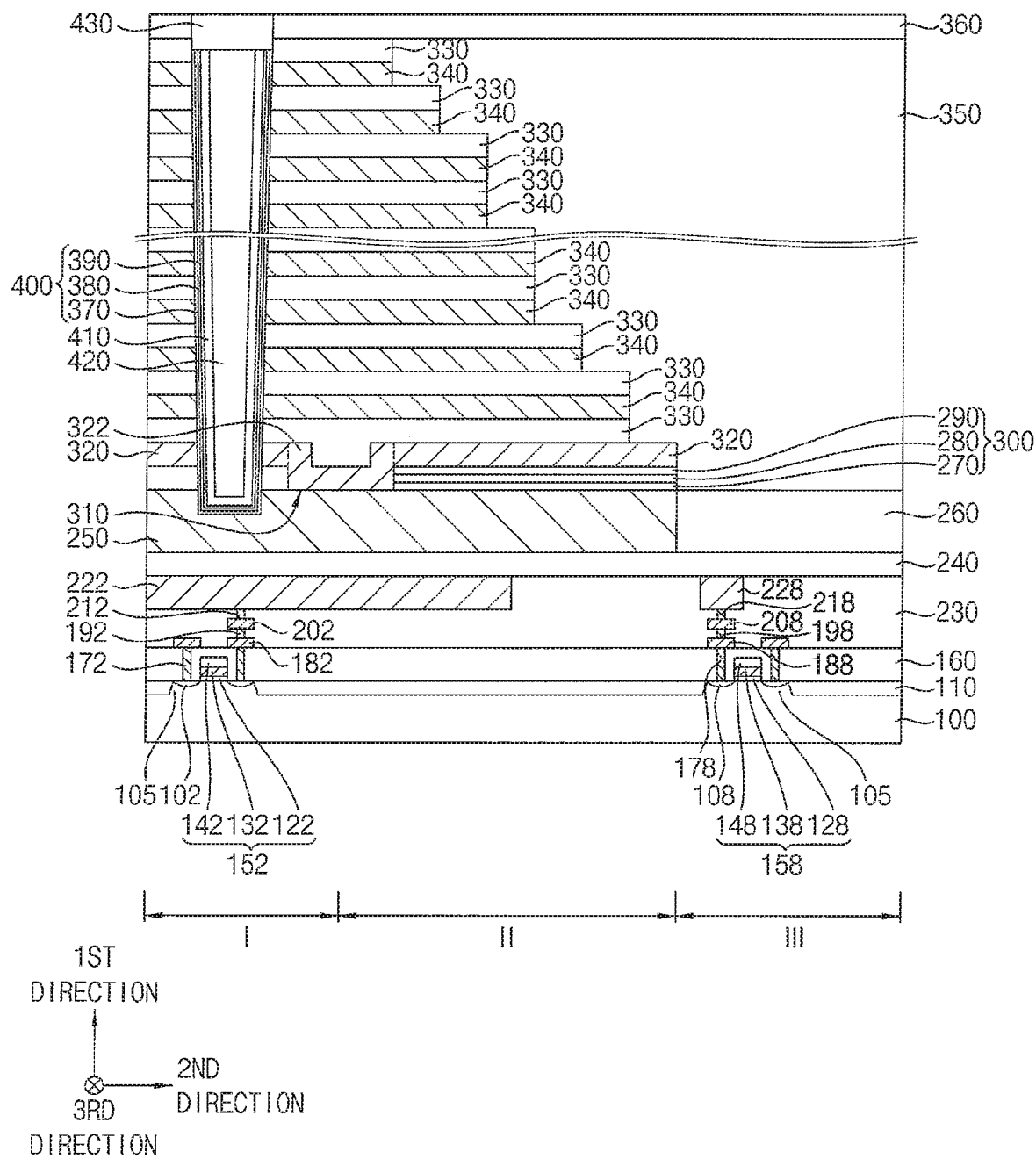

Referring to FIG. 24, a fifth insulating interlayer 350 may be formed on the mold and the fourth insulating interlayer pattern 260, and may be planarized until an upper surface of the uppermost one of the insulation layers 330 is exposed.

A sixth insulating interlayer 360 may be formed on the fifth insulating interlayer 350 and the uppermost one of the insulation layers 330, and the sixth insulating interlayer 360, the mold, the support layer 320 and the sacrificial layer structure 300 may be etched by an etching process to form a channel hole therethrough exposing an upper surface of the second substrate 250 in the first region I of the first substrate 100.

In some example embodiments, the etching process may be performed until the upper surface of the second substrate 250 is exposed, and further the channel hole may extend through an upper portion of the second substrate 250. A plurality of channel holes may be formed to be spaced apart from each other in each of the second and third directions, which may form a channel hole array.

A charge storage structure 400, a channel 410, a filling pattern 420 and a pad 430 may be formed in the channel hole.

Particularly, a charge storage structure layer and a channel layer may be formed on a sidewall of the channel hole, the upper surface of the second substrate 250 exposed by the channel hole and the sixth insulating interlayer 360, and a filling layer may be formed on the channel layer to fill the channel hole, and the filling layer, the channel layer and the charge storage structure layer may be planarized until an upper surface of the sixth insulating interlayer 350 is exposed.

By the planarization process, the charge storage structure 400 and the channel 410 may be sequentially stacked on the sidewall of the channel hole and the upper surface of the second substrate 250, and the filling pattern 420 may fill an inner space formed by the channel 410.

As the channel holes form the channel hole array, the channels 410 in the channel holes may also form a channel array.

In some example embodiments, the charge storage structure 400 may include a tunnel insulation pattern 390, a charge storage pattern 380 and a first blocking pattern 370 sequentially stacked in a horizontal direction substantially parallel to the upper surface of the first substrate 100 from an outer sidewall of the channel 410.

An upper portion of the charge storage structure 400, the channel 410 and the filling pattern 420 may be removed to form a second recess, a pad layer may be formed on the sixth insulating interlayer 360 to fill the second recess, and may be planarized until the upper surface of the sixth insulating interlayer 360 is exposed to form a pad 430.

Figure 25:
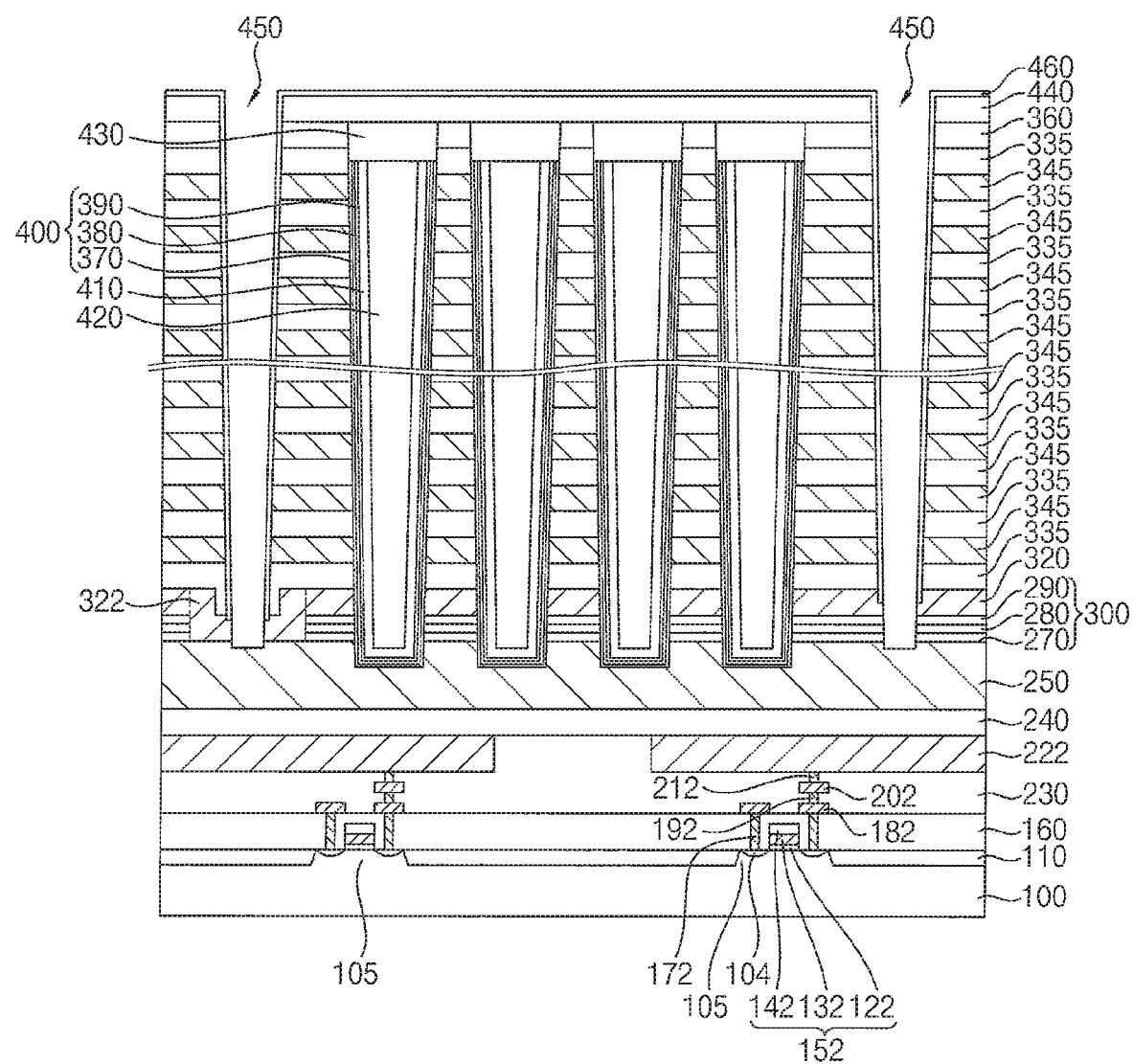
Figure 25:
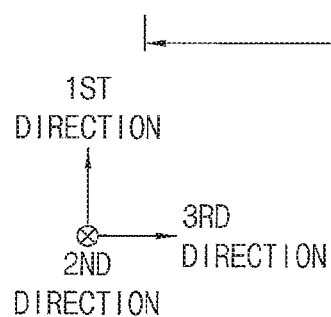

Referring to FIG. 25, a seventh insulating interlayer 440 may be formed on the sixth insulating interlayer 360 and the pad 430, and a tenth opening 450 may be formed through the sixth and seventh insulating interlayers 360 and 440 and the mold in the first and second regions I and II of the first substrate 100 by, e.g., a dry etching process.

The dry etching process may be performed until the tenth opening 450 exposes an upper surface of the support layer 320 or the support pattern 322, and further the tenth opening 450 may extend through an upper portion of the support layer 320 or the support pattern 322. As the tenth opening 450 is formed, the insulation layer 330 and the fourth sacrificial layer 340 in the mold may be exposed.

In some example embodiments, the tenth opening 450 may extend in the second direction in the first and second regions I and II of the first substrate 100, and a plurality of tenth openings 450 may be formed in the third direction. As the tenth opening 450 is formed, the insulation layer 330 may be divided into a plurality of insulation patterns 335 each extending in the second direction and the fourth sacrificial layer 340 may be divided into a plurality of fourth sacrificial patterns 345 each extending in the second direction.

A first spacer layer may be formed on a sidewall of the tenth opening 450 and an upper surface of the seventh insulating interlayer 440, and may be anisotropically etched to form a first spacer 460 on the sidewall of the tenth opening 450. Thus, portions of the support layer 320 and the support pattern 322 may be exposed.

The exposed portions of the support layer 320 and the support pattern 322 and a portion of the sacrificial layer structure 300 thereunder may be removed to enlarge the tenth opening 450 downwardly. Accordingly, the tenth opening 450 may expose an upper surface of the second substrate 250, and further extend through an upper portion of the second substrate 250.

In some example embodiments, the first spacer 460 may include undoped or doped amorphous silicon or polysilicon. When the sacrificial layer structure 300 is partially removed, the sidewall of the tenth opening 450 may be covered by the first spacer 460, and thus the insulation pattern 335 and the fourth sacrificial pattern 345 in the mold may not be removed.

Figure 26:
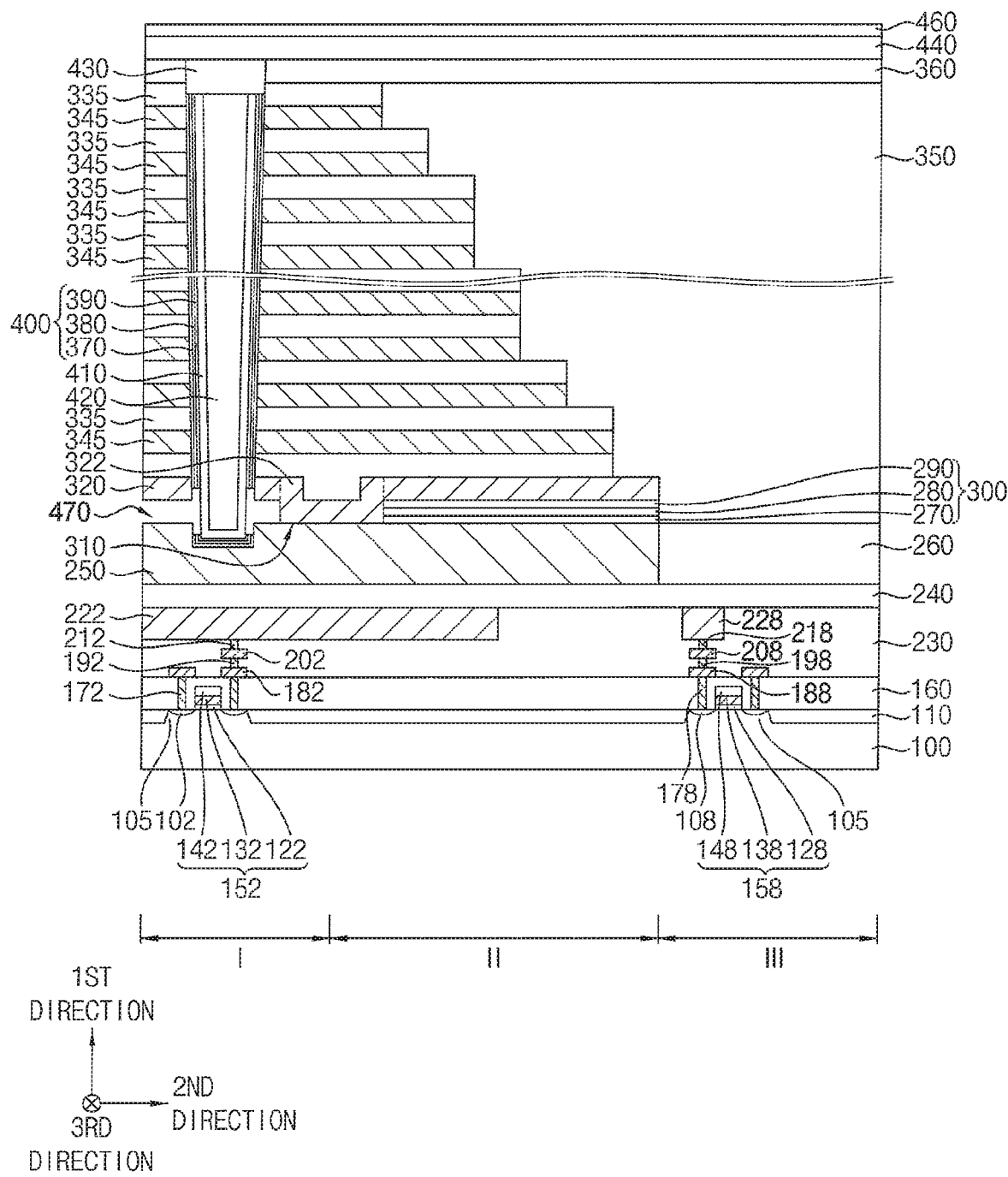
Figure 27:
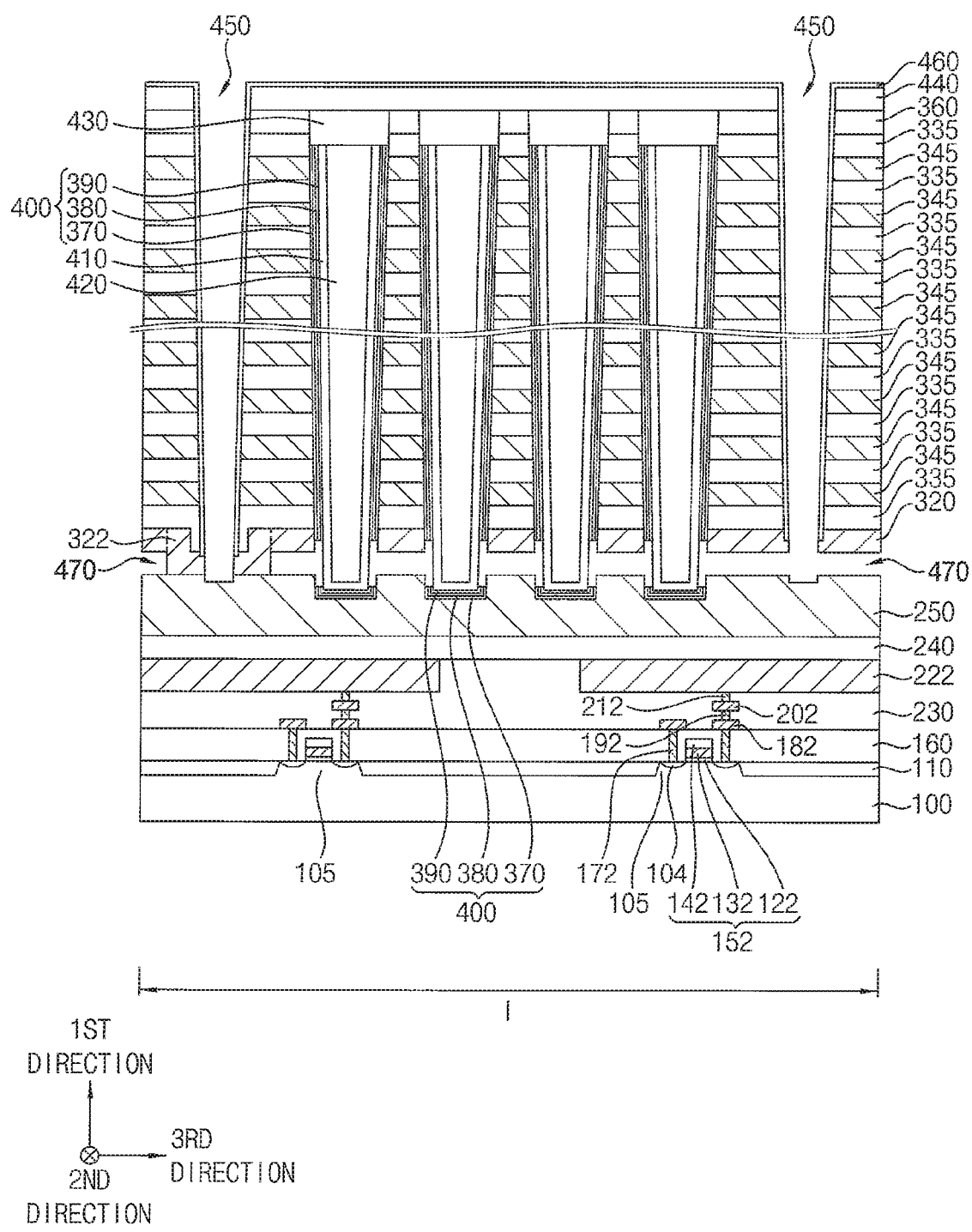

Referring to FIGS. 26 and 27, a portion of the sacrificial layer structure 300 in the first region I of the first substrate 100 may be removed through the tenth opening 450 by, e.g., a wet etching process, and thus a first gap 470 may be formed.

The wet etching process may be performed using, e.g., HF or $H_3PO_4$.

As the first gap 470 is formed in the first region I of the first substrate 100, a lower portion of the support layer 320 and an upper portion of the second substrate 250 adjacent the tenth opening 450 may be exposed. Additionally, a sidewall of a portion of the charge storage structure 400 may be exposed by the first gap 470, and the exposed sidewall of the portion of the charge storage structure 400 may also be removed during the wet etching process to expose an outer sidewall of a portion of the channel 410. Accordingly, the charge storage structure 400 may be divided into an upper portion extending through the mold to cover an outer sidewall of most portion of the channel 410 and a lower portion covering a bottom and an outer sidewall of a lower portion of the channel 410 on the second substrate 250.

When the first gap 470 is formed by the wet etching process, the support layer 320 and the support pattern 322 may not be removed, and thus the mold may not fall down.

Figure 28:
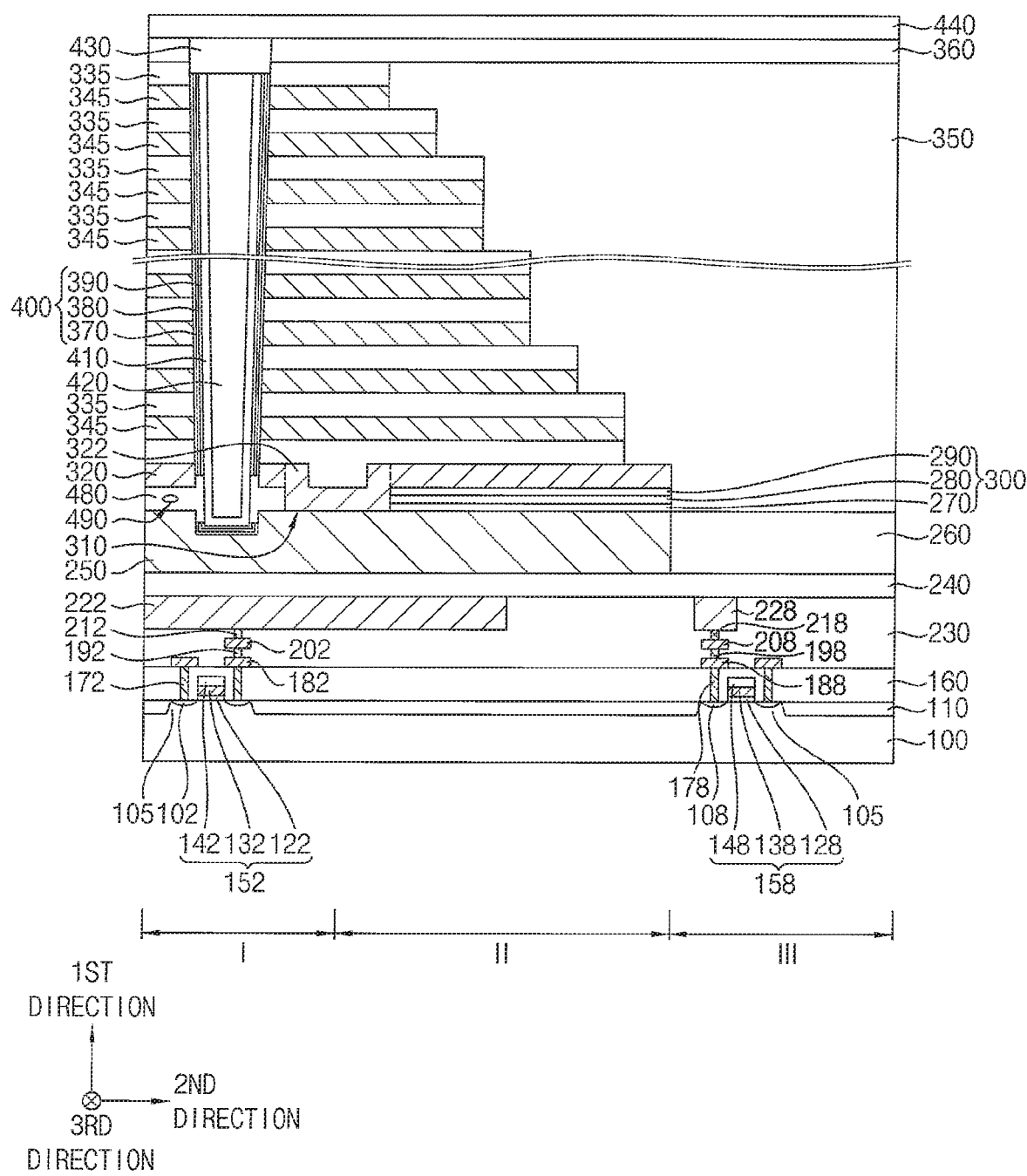
Figure 29:
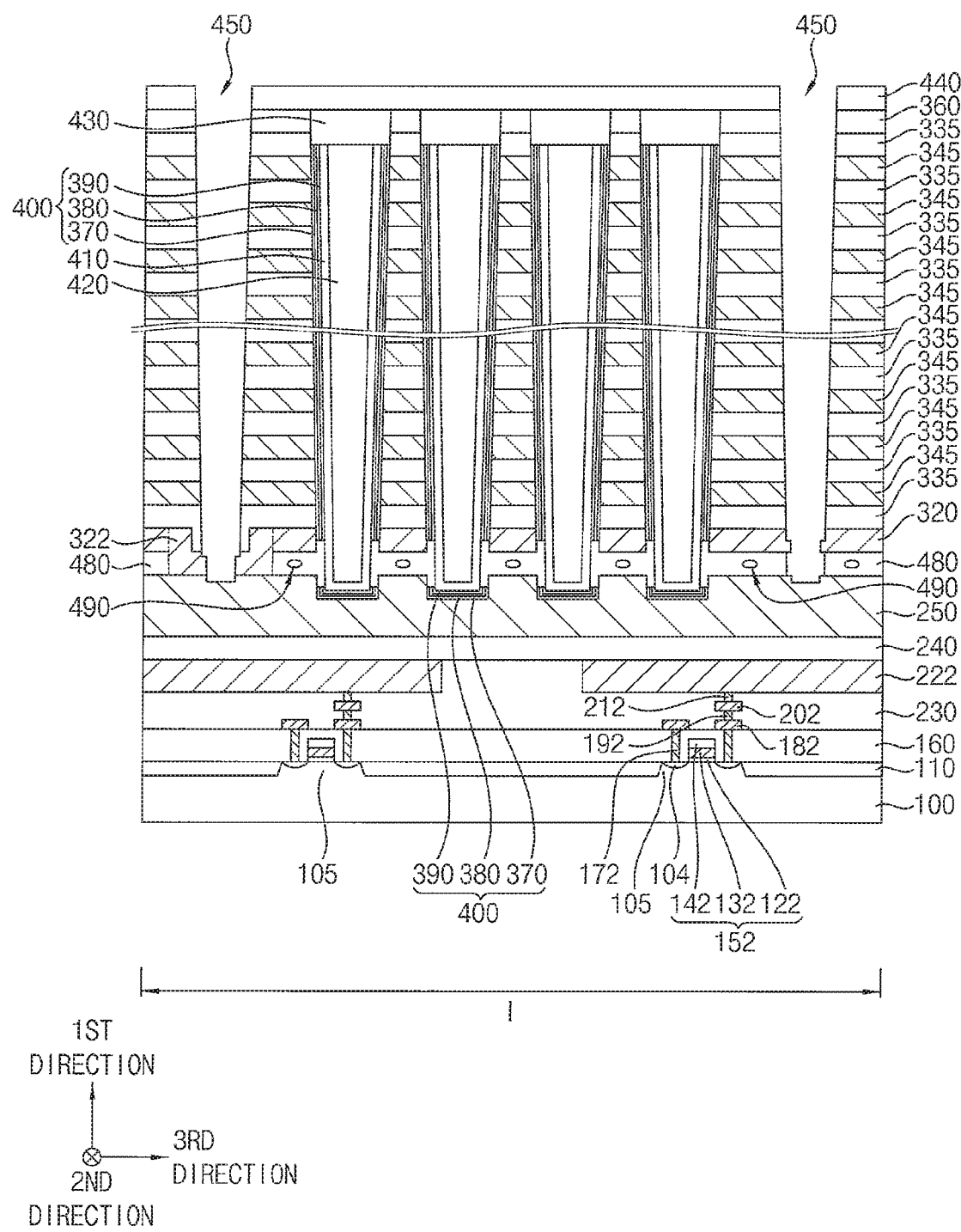

Referring to FIGS. 28 and 29, the first spacer 460 may be removed, and a channel connection layer may be formed on the sidewall of the tenth opening 450 and in the first gap 470. A portion of the channel connection layer in the tenth opening 450 may be removed by, e.g., an etch back process to form a channel connection pattern 480 in the first gap 470.

As the channel connection pattern 480 is formed, ones of the channels 410 in the channel array may be connected with each other. An air gap 490 may be formed in the channel connection pattern 480.

Figure 30:
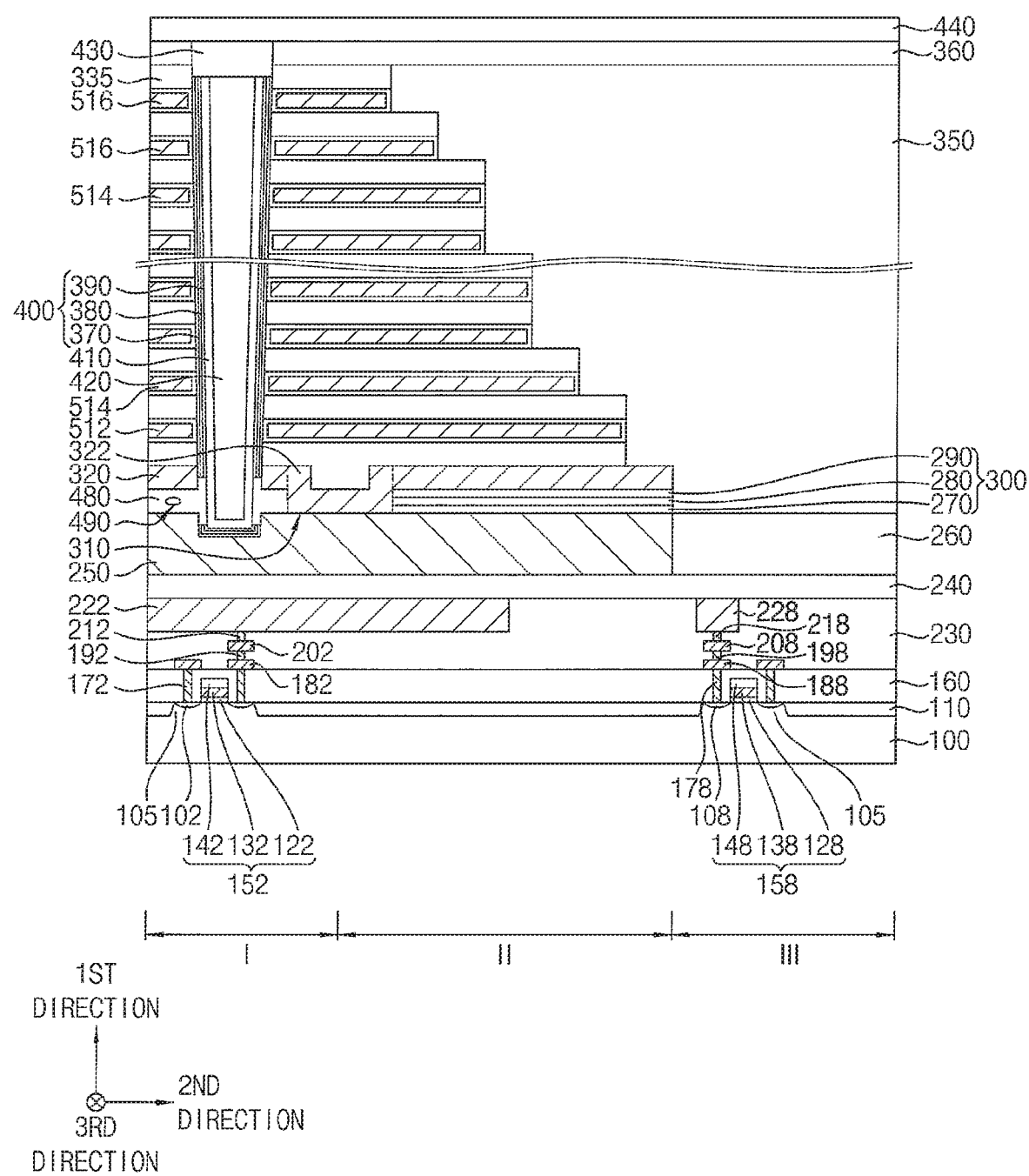
Figure 31:
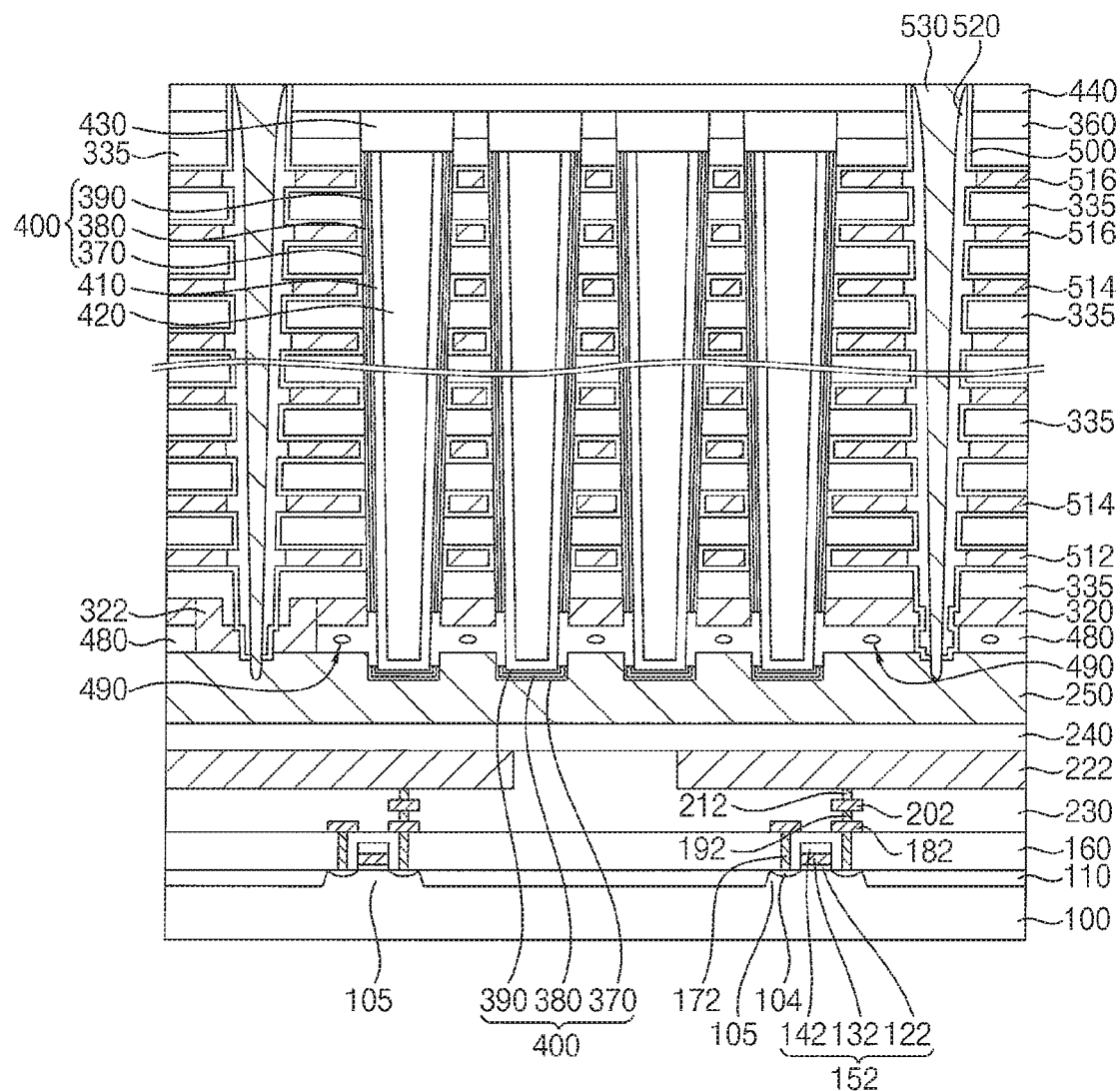
Figure 31:
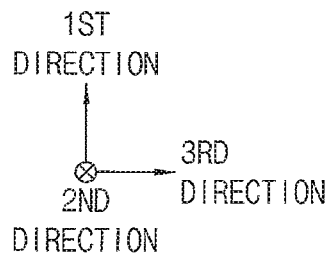

Referring to FIGS. 30 and 31, the fourth sacrificial patterns 345 exposed by the tenth opening 450 may be removed to form a second gap between the insulation patterns 335 neighboring in the first direction, and an outer sidewall of the first blocking pattern 370 may be partially exposed by the second gap.

In some example embodiments, the fourth sacrificial patterns 345 may be removed by a wet etching process using, e.g., $H_3PO_4$ or $H_2SO_4$.

A second blocking layer 500 may be formed on the exposed outer sidewall of the first blocking pattern 370, an inner wall of the second gap, a surface of the insulation pattern 325, a sidewall and a lower surface of a portion of the support layer 320, a sidewall of the support pattern 322, a sidewall of the channel connection pattern 480, an upper surface of the second substrate 250, and an upper surface of the seventh insulating interlayer 440, and a gate electrode layer may be formed on the second blocking layer 500.

The gate electrode layer may include a gate barrier layer and a gate conductive layer sequentially stacked.

The gate electrode layer may be partially removed to form a gate electrode in each of the second gaps. In some example embodiments, the gate electrode layer may be partially removed by a wet etching process.

In some example embodiments, the gate electrode may extend in the second direction, and a plurality of gate electrodes may be stacked in the first direction. In some example embodiments, a plurality of gate electrodes may be formed to be spaced apart from each other in the first direction. Additionally, a plurality of gate electrodes may be formed to be spaced apart from each other in the third direction. That is, the plurality of gate electrodes at the same level may be spaced apart from each other in the third direction by the tenth opening 450. The gate electrode may include first, second and third gate electrodes 512, 514 and 516 sequentially stacked in the first direction.

A second spacer 520 may be formed on a sidewall of the tenth opening 450, and a common source pattern (CSP) 530 may be formed to fill the tenth opening 450.

The second spacer 520 may be formed by forming a second spacer layer on the upper surface of the second substrate 250 exposed by the tenth opening 450, the sidewall of the tenth opening 450 and an upper surface of the seventh insulating interlayer 440, and anisotropically etching the second spacer layer, and the CSP 530 may be formed by forming a CSP layer on the upper surface of the second substrate 250 exposed by the tenth opening 450, the second spacer 520, and the seventh insulating interlayer 440, and planarizing the CSP layer until the upper surface of the seventh insulating interlayer 440 is exposed.

In some example embodiments, the CSP 530 may extend in the second direction, and the CSP 530 and the second spacer 520 on the sidewall thereof may divide each of the first to third gate electrodes 512, 514 and 516 in the third direction.

Figure 32:
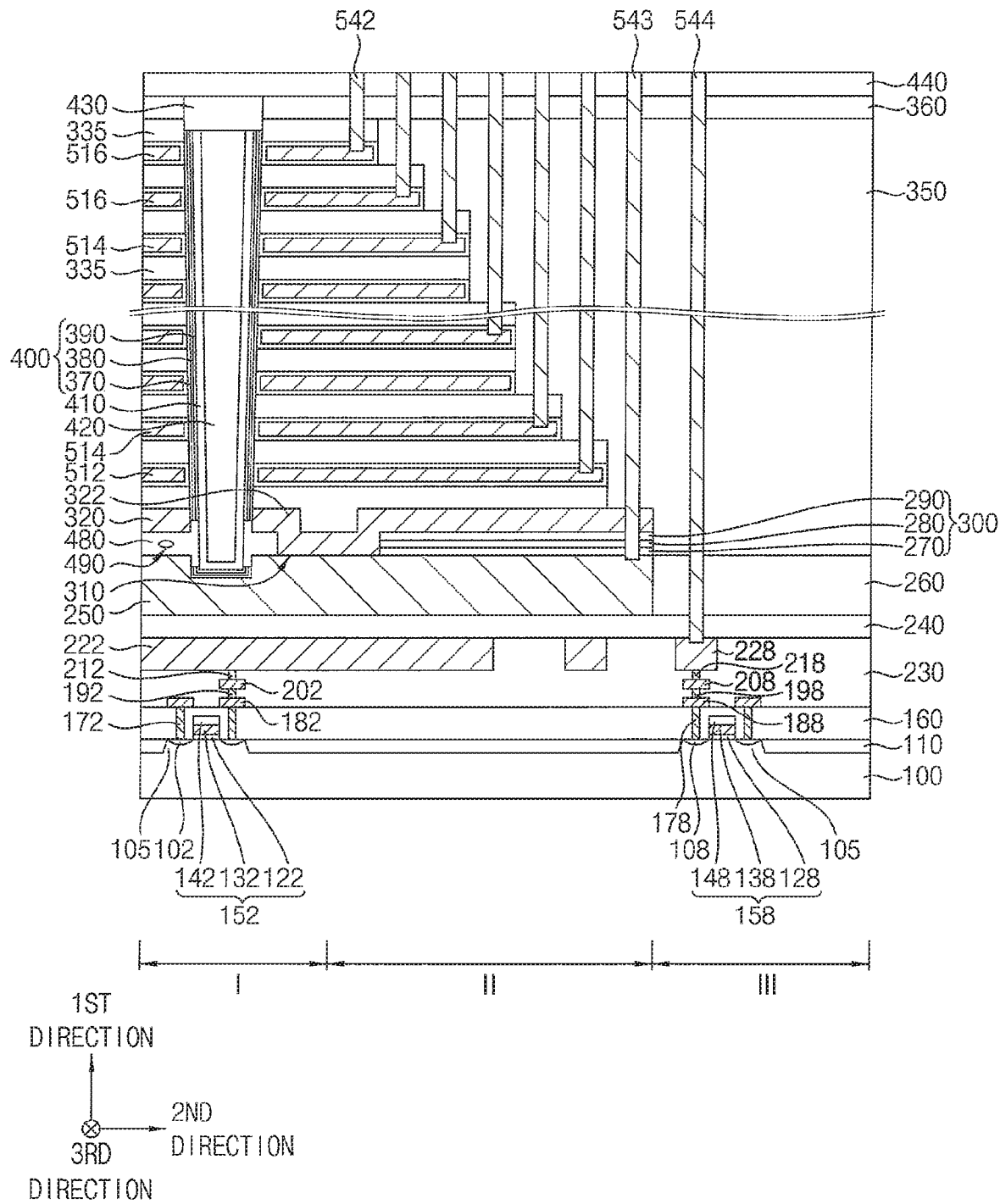

Referring to FIG. 32, a first contact plug 542, second contact plug 543, and third contact plug 544 may be formed. The first contact plug 542 may extend through the fifth to seventh insulating interlayers 350, 360 and 440, the insulation patterns 335 and the second blocking layer 500 to contact one of the first to third gate electrodes 512, 514 and 516 in the second region II of the first substrate 100. The second contact plug 543 may extend through the fifth to seventh insulating interlayers 350, 360 and 440, the support layer 320 and the sacrificial layer structure 300 to contact an upper surface of the second substrate 250 in the second region II of the first substrate 100. The third contact plug 544 may extend through the fifth to seventh insulating interlayers 350, 360 and 440, the fourth insulating interlayer pattern 260 and the third insulating interlayer 240 to contact an upper surface of the sixth lower wiring 228 in the third region III of the first substrate 100.

Referring to FIGS. 18 and 19, eighth to thirteenth insulating interlayers 560, 580, 600, 620, 640 and 660 may be formed on the seventh insulating interlayer 440, the CSP 530 and the first to third contact plugs 542, 543 and 544. First to fifth upper contact plugs 572, 573, 574, 578 and 579, first to twelfth upper wirings 592, 593, 594, 598, 599, 632, 633, 634, 638, 639, 674, 679, and first to seventh upper vias 612, 613, 614, 618, 619, 654, 659, which may extend through ones of the eighth to thirteenth insulating interlayers 560, 580, 600, 620, 640 and 660 to be electrically connected to corresponding ones of the first to third contact plugs 542, 543 and 544, the pad 430 and the CSP 530, respectively, may be formed to complete the fabrication of the vertical memory device.

Particularly, the first to twelfth upper wirings 592, 593, 594, 598, 599, 632, 633, 634, 638, 639, 674, 679 may be formed by the damascene process illustrated with reference to FIGS. 1 to 17B, and thus may have improved electrical characteristics and no void therein.

As described above, although the present inventive concepts have been described with reference to some example embodiments, those skilled in the art will readily appreciate that many modifications are possible in the various example embodiments without materially departing from the novel teachings and advantages of the present inventive concepts.

What is claimed is:

1. A wiring structure, comprising:
    a first metal pattern on a substrate, the first metal pattern extending in a second direction that is parallel to an upper surface of the substrate and having a first width in a third direction that is parallel to the upper surface of the substrate and perpendicular to the second direction;
    a second metal pattern extending in the third direction to cross the first metal pattern, the second metal pattern having a second width in the second direction; and
    a third metal pattern at an area where the first and second metal patterns cross each other on the substrate, the third metal pattern connected to the first and second metal patterns and having a substantially rectangular shape in a plan view, the third metal pattern having concave portions in each quadrant thereof, the third metal pattern having a third width defined as a minimum distance between opposite concave portions of the third metal pattern in a fourth direction that is parallel to the upper surface of the substrate and that has an acute angle with respect to each of the second and third directions, wherein the third width is less than or equal to a smaller of the first and second widths, wherein the first metal pattern has a first boundary surface at a central portion in the third direction thereof, the first boundary surface extending in a first direction perpendicular to the upper surface of the substrate, and the third metal pattern has a third boundary surface at a central portion in the fourth direction thereof, the third boundary surface extending in the first direction, and wherein a bottom of the first boundary surface is farther from the substrate than a bottom of the third boundary surface.

2. The wiring structure as claimed in claim 1, wherein the second metal pattern has a second boundary surface at a central portion in the second direction thereof, the second boundary surface extending in the first direction, and wherein a bottom of the second boundary surface is farther from the substrate than the bottom of the third boundary surface.

3. The wiring structure as claimed in claim 1, wherein the first width is equal to or less than the second width.

4. The wiring structure as claimed in claim 1, wherein the concave portions of the third metal pattern are each defined by an arc segment.

5. The wiring structure as claimed in claim 1, wherein an angle of a sidewall in the third direction of the first metal pattern with respect to the first direction is greater than an angle of a sidewall of each of the concave portions of the third metal pattern with respect to the first direction.

6. The wiring structure as claimed in claim 5, wherein an angle of a sidewall in the second direction of the second metal pattern with respect to the first direction is greater than the angle of the sidewall of each of the concave portions of the third metal pattern with respect to the first direction.

7. The wiring structure as claimed in claim 1, further comprising an insulating interlayer that covers sidewalls of the first to third metal patterns on the substrate.

8. The wiring structure as claimed in claim 7, wherein upper surfaces of the first to third metal patterns are higher than an upper surface of the insulating interlayer.

9. The wiring structure as claimed in claim 1, wherein an upper surface of each of the first to third metal patterns is substantially flat.

10. The wiring structure as claimed in claim 1, wherein the first to third metal patterns include a same material.

11. The wiring structure as claimed in claim 10, wherein each of the first to third metal patterns includes tungsten, aluminum or copper.

12. A wiring structure, comprising:

a first metal pattern on a substrate, the first metal pattern extending in a second direction that is parallel to an upper surface of the substrate and having a first width in a third direction that is parallel to the upper surface of the substrate and perpendicular to the second direction;

a second metal pattern extending in the third direction to cross the first metal pattern and having a second width in the second direction;

a third metal pattern at an area where the first and second metal patterns cross each other on the substrate, wherein the third metal pattern is connected to the first and second metal patterns and has a substantially rectangular shape in a plan view; and an insulation spacer on the substrate, wherein the insulation spacer is at a central portion of the third metal pattern in a plan view and covers a sidewall of the third metal pattern, wherein a third width that is defined as a minimum distance between a vertex of the third metal pattern and the insulation spacer is less than or equal to a smaller of the first and second widths.

13. The wiring structure as claimed in claim 12, wherein the insulation spacer has a shape of a circle or ellipse in a plan view.

14. The wiring structure as claimed in claim 12, further comprising an insulating interlayer that covers sidewalls of the first to third metal patterns on the substrate, wherein the insulation spacer includes a same material as that of the insulating interlayer, and an upper surface of the insulation spacer is substantially coplanar with an upper surface of the insulating interlayer.

15. The wiring structure as claimed in claim 14, wherein an upper surface of each of the first to third metal patterns is substantially flat.

16. The wiring structure as claimed in claim 15, wherein the upper surfaces of the first to third metal patterns are higher than the upper surface of the insulating interlayer.

17. The wiring structure as claimed in claim 12, wherein a sidewall in the third direction of the first metal pattern has a first angle with respect to a first direction perpendicular to the upper surface of the substrate and a sidewall in the second direction of the second metal pattern has the first angle with respect to the first direction, and wherein a sidewall of the third metal pattern contacting the insulation spacer has a second angle with respect to the first direction, the second angle being less than the first angle.

18. The wiring structure as claimed in claim 12, wherein each metal pattern has a boundary surface at a central portion thereof, each boundary surface extending in a first direction perpendicular to the upper surface of the substrate.

19. The wiring structure as claimed in claim 18, wherein a bottom of each of the boundary surfaces of the first and second metal patterns is farther from the substrate than a bottom of the boundary surface of the third metal pattern.

20. A wiring structure, comprising:

a first metal pattern on a substrate, the first metal pattern extending in a second direction that is parallel to an upper surface of the substrate and having a first width in a third direction that is parallel to the upper surface of the substrate and perpendicular to the second direction;

a second metal pattern extending in the third direction and having the first width in the second direction; and a third metal pattern at an area where an end portion of the first metal pattern meets an end portion of the second metal pattern, the third metal pattern being connected to the first and second metal patterns and having a shape of a substantially triangular shape, wherein a second width defined as a minimum distance from a vertex of the third metal pattern to an opposite edge thereof in a fourth direction that is parallel to the upper surface of the substrate and that has an acute angle with respect to each of the second and third directions is equal to or less than the first width, wherein each metal pattern has a respective boundary surface at a central portion thereof that extends in a first direction perpendicular to the upper surface of the substrate, and wherein a bottom of the boundary surfaces of the first and second metal patterns is farther from the substrate than a bottom of the boundary surface of the third metal pattern.

* * * * *